(12) United States Patent
Jerschow et al.

(10) Patent No.: US 10,712,297 B2
(45) Date of Patent: Jul. 14, 2020

(54) SYSTEMS AND METHODS FOR SUPER-RESOLUTION SURFACE-LAYER MICROSCOPY USING MAGNETIC RESONANCE

(71) Applicant: NEW YORK UNIVERSITY, New York, NY (US)

(72) Inventors: Alexej Jerschow, New York, NY (US); Andrew J. Ilott, Rahway, NJ (US)

(73) Assignee: NEW YORK UNIVERSITY, New York, NY (US)

( * ) Notice: Subject to any disclaimer, the term of this patent is extended or adjusted under 35 U.S.C. 154(b) by 116 days.

(21) Appl. No.: 15/785,284

(22) Filed: Oct. 16, 2017

(65) Prior Publication Data
US 2018/0052123 A1 Feb. 22, 2018

Related U.S. Application Data

(63) Continuation-in-part of application No. PCT/US2016/027624, filed on Apr. 14, 2016.

(60) Provisional application No. 62/431,075, filed on Dec. 7, 2016, provisional application No. 62/149,159, filed on Apr. 17, 2015.

(51) Int. Cl.
| | |
|---|---|
| *G01N 24/08* | (2006.01) |
| *G01N 24/10* | (2006.01) |
| *G01R 33/56* | (2006.01) |
| *G01R 31/36* | (2020.01) |
| *G01R 31/385* | (2019.01) |
| *G01R 33/483* | (2006.01) |

(52) U.S. Cl.
CPC ............ *G01N 24/08* (2013.01); *G01N 24/10* (2013.01); *G01R 31/385* (2019.01); *G01R 33/4833* (2013.01); *G01R 33/5608* (2013.01)

(58) Field of Classification Search
None
See application file for complete search history.

(56) References Cited

U.S. PATENT DOCUMENTS

| | | | |
|---|---|---|---|
| 6,256,603 B1 * | 7/2001 | Celniker | G01V 1/282 702/6 |
| 6,774,635 B1 | 8/2004 | Gerald, II et al. | |
| 2006/0071662 A1 * | 4/2006 | Xiang | B82Y 35/00 324/316 |
| 2006/0291364 A1 | 12/2006 | Kozicki | |

(Continued)

OTHER PUBLICATIONS

Chernova, N.A., et al., "Layered LixNiyMnyCo1-2yO2 Cathodes for Lithium Ion Batteries: Understanding Local Structure via Magnetic Properties", Chem. Mater., 2007, 19(19):4682-4693.

(Continued)

*Primary Examiner* — Jermele M Hollington
*Assistant Examiner* — Suresh K Rajaputra
(74) *Attorney, Agent, or Firm* — Foley & Lardner LLP

(57) ABSTRACT

A method of probing the layers above, at, and below the surface of a conducting region includes exciting nuclear or electronic spins within the conducting region using a first frequency, receiving a second frequency from the conducting region, determining the length scales by the conductivity of the conducting region, the first frequency, and the second frequency, obtaining a depth profile of the conducting region, and indirectly measuring the presence of the surface by characterizing signal distortions above the surface.

24 Claims, 25 Drawing Sheets

(56) References Cited

U.S. PATENT DOCUMENTS

| | | | |
|---|---|---|---|
| 2007/0287184 A1 | 12/2007 | Telkki et al. | |
| 2007/0299628 A1* | 12/2007 | Sun | G01B 21/085 |
| | | | 702/170 |
| 2008/0231281 A1* | 9/2008 | Fain | G01R 33/345 |
| | | | 324/322 |
| 2011/0160563 A1* | 6/2011 | Glogau | A61B 5/055 |
| | | | 600/410 |
| 2013/0088204 A1 | 4/2013 | Khare et al. | |
| 2013/0093428 A1 | 4/2013 | Tinnemeyer | |
| 2014/0184224 A1* | 7/2014 | Nevo | G01N 24/081 |
| | | | 324/318 |
| 2016/0116540 A1* | 4/2016 | Zheng | H01M 12/08 |
| | | | 324/322 |

OTHER PUBLICATIONS

Hertz, J.T., et al., "Magnetism and structure of LixCoO2 and comparison to NaxCoO2", Phys. Rev. B, 2008, 77(7):75119-75131.

Ilott, A. J., et al., "Visualizing skin effects in conductors with MRI: 7Li MRI experiments and calculations", J. Magn. Reson, 2014, 245:143-149.

Kadyk, T., et al., "Magnetic susceptibility as a direct measure of oxidation state in LiFePO4 batteries and cyclic water gas shift reactors", Phys. Chem. Chem. Phys., 2015, 17(30):19834-19843.

Robinson, S., et al., "A Method for Unwrapping Highly Wrapped Multi-echo Phase Images at Very High Field: UMPIRE", Magn. Reson. Med. Off. J. Soc. Magn. Reson. Med. Soc. Magn. Reson. Med., 2014, 72(1):80-92.

Salomir, R., et al., "A Fast Calculation Method for Magnetic Field Inhomogeneity due to an Arbitrary Distribution of Bulk Susceptibility", Concepts Magn. Reson., 2003, 19B(1):26-34.

International Search Report and Written Opinion for PCT/US2016/027624, dated Aug. 19, 2016, 11 pages.

International Search Report and Written Opinion in PCT/US2017/064948, dated Feb. 28, 2018, 10 pages.

Baker, D.R., et al., "Temperature and Current Distribution in Thin-Film Batteries", Journal of the Electrochemical Society, 1999, 146(7):2413-2424.

Chang, H.J., et al., "Correlating Microstructural Lithium Metal Growth with Electrolyte Salt Depletion in Lithium Batteries Using 7Li MRI", Journal of the American Chemical Society, Nov. 7, 2015, 137(48):15209-15216.

Cheng, J-H., et al., "Visualization of Lithium Plating and Stripping via in Operando Transmission X-ray Microscopy", The Journal of Physical Chemistry C, 2017, 121(14):7761-7766.

Davies, G., et al., "State of Charge and State of Health Estimation Using Electrochemical Acoustic Time of Flight Analysis", Journal of the Electrochemical Society, 2017, 164(12):A2746-A2755.

Finegan, D.P., et al., "In-operando high-speed tomography of lithium-ion batteries during thermal runaway", Nature Communications, Apr. 28, 2015, 6:6924, 10 pages.

Halpern-Manners, N.W., et al., "Magnetic resonance imaging of oscillating electrical currents", PNAS, May 11, 2010, 107(19):8519-8524.

Hsieh, A.G., et al., "Electrochemical-Acoustic Time of Flight: In Operando Correlation of Physical Dynamics with Battery Charge and Health", Energy & Environmental Science, 2015, 8:1569-1577.

Ilott, A.J., et al., "Super-resolution Surface Microscopy of Conductors using Magnetic Resonance", Scientific Reports, 2017, 7:5425, 7 pages.

Ilott, A.J., et al., "Multinuclear in situ magnetic resonance imaging of electrochemical double-layer capacitors", Nature Communications, Aug. 1, 2014, 5:4536, 6 pages.

Ilott, A.J., et al., "Real-time 3D imaging of microstructure growth in battery cells using indirect MRI", PNAS, Sep. 27, 2016, 113(39):10779-10784.

Ilott, A.J., et al., "Rechargeable lithium-ion cell state of charge and defect detection by in-situ inside-out magnetic resonance imaging", Nature Communications, 2018, 9:1776, 7 pages.

Johansen, T.H., et al., "Direct observation of the current distribution in thin superconducting strips using magneto-optic imaging", Physical Review B, Dec. 1, 1996, 54(2):16 264-16 269.

Joy, M.L.G., et al., "Imaging of Current Density and Current Pathways in Rabbit Brain During Transcranial Electrostimulation", IEEE Transactions on Biomedical Engineering, Sep. 1999, 46(9):1139-1149.

Joy, M., et al., "In vivo detection of applied electric currents by magnetic resonance imaging", Magnetic Resonance Imaging, 1989, 7(1):89-94.

Lim, J., et al., "Origin and hysteresis of lithium compositional spatiodynamics within battery primary particles", Science, Aug. 5, 2016, 353(6299):566-571.

Liu, J., et al., "Visualization of Charge Distribution in a Lithium Battery Electrode", The Journal of Physical Chemistry Letters, Aug. 16, 2010, 1(14):2120-2123.

Manassen, Y., et al., "Mapping of Electrical Circuits Using Chemical-Shift Imaging", Journal of Magnetic Resonance, 1988, 76(2):371-374.

Morcrette, M., et al., "In situ X-ray diffraction techniques as a powerful tool to study battery electrode materials", Electrochimica Acta, 2002, 47(19):3137-3149.

Neimoller, A., et al., "EPR Imaging of Metallic Lithium and its Application to Dendrite Localisation in Battery Separators", Scientific Reports, Sep. 25, 2018, 8:14331, 7 pages.

Panitz, J-C., et al., "Raman Microscopy Applied to Rechargeable Lithium-Ion Cells-Steps towards in situ Raman Imaging with Increased Optical Efficiency", Applied Spectroscopy, 2001, 55(9):1131-1137.

Paxton, W.A., et al., "Tracking inhomogeneity in high-capacity lithium iron phosphate batteries", Journal of Power Sources, 2015, 275:429-434.

Petibon, R., et al., "Study of Electrolyte Additives Using Electrochemical Impedance Spectroscopy on Symmetric Cells", Journal of the Electrochemical Society, 2013, 160(1):A117-A124.

Samba, A., et al., "Impact of Tab Location on Large Format Lithium-Ion Pouch Cell Based on Fully Coupled Tree-Dimensional Electrochemical-Thermal Modeling", Electrochimica Acta, 2014, 147:319-329.

Sathiya, M., et al., "Electron paramagnetic resonance imaging for real-time monitoring of Li-ion batteries", Nature Communications, Feb. 9, 2015, 6:6276, 7 pages.

Shin, J., et al., "Initial study on in vivo conductivity mapping of breast cancer using MRI", Journal of Magnetic Resonance Imaging, 2015, 42(2):371-378.

Taheri, P., et al., "Theoretical Analysis of Potential and Current Distributions in Planar Electrodes of Lithium-ion Batteries", Electrochimica Acta, 2014, 133:197-208.

Taminato, S., et al., "Real-time observations of lithium battery reactions—operando neutron diffraction analysis during practical operation", Scientific Reports, Jun. 30, 2016, 6:28843, 12 pages.

Tang, J.A., et al., "Non-Destructive Monitoring of Charge-Discharge Cycles on Lithium Ion Batteries using 7Li Stray-Field Imaging", Scientific Reports, Sep. 5, 2013, 3:2596, 6 pages.

Tuch, D.S., et al., "Conductivity tensor mapping of the human brain using diffusion tensor MRI", PNAS, Sep. 25, 2001, 98(20):11697-11701.

Van Lier, A., et al., "B Phase mapping at 7 T and its application for in vivo electrical conductivity mapping", Magnetic Resonance in Medicine, 2012, 67(2):552-561.

Wandt, J., et al., "Operando electron paramagnetic resonance spectroscopy—formation of mossy lithium on lithium anodes during charge-discharge cycling", Energy & Environmental Science, 2015, 8:1358-1367.

Wood, K.N., et al., "Dendrites and Pits: Untangling the Complex Behavior of Lithium Metal Anodes through Operando Video Microscopy", ACS Central Science, 2016, 2(11):790-801.

Zhang, G., et al., "Effects of Non-Uniform Current Distribution on Energy Density of Li-Ion Cells", Journal of the Electrochemical Society, 2013, 160(11):A2299-A2305.

Zhang, X., et al., "Imaging Electric Properties of Biological Tissues by RF Field Mapping in MRI", IEEE Transactions on Medical Imaging, Feb. 2010, 29(2):474-481.

(56) References Cited

OTHER PUBLICATIONS

Zhang, G., et al., "In-Situ Measurement of Current Distribution in a Li-Ion Cell", Journal of the Electrochemical Society, 2013, 160(4):A610-A615.

* cited by examiner

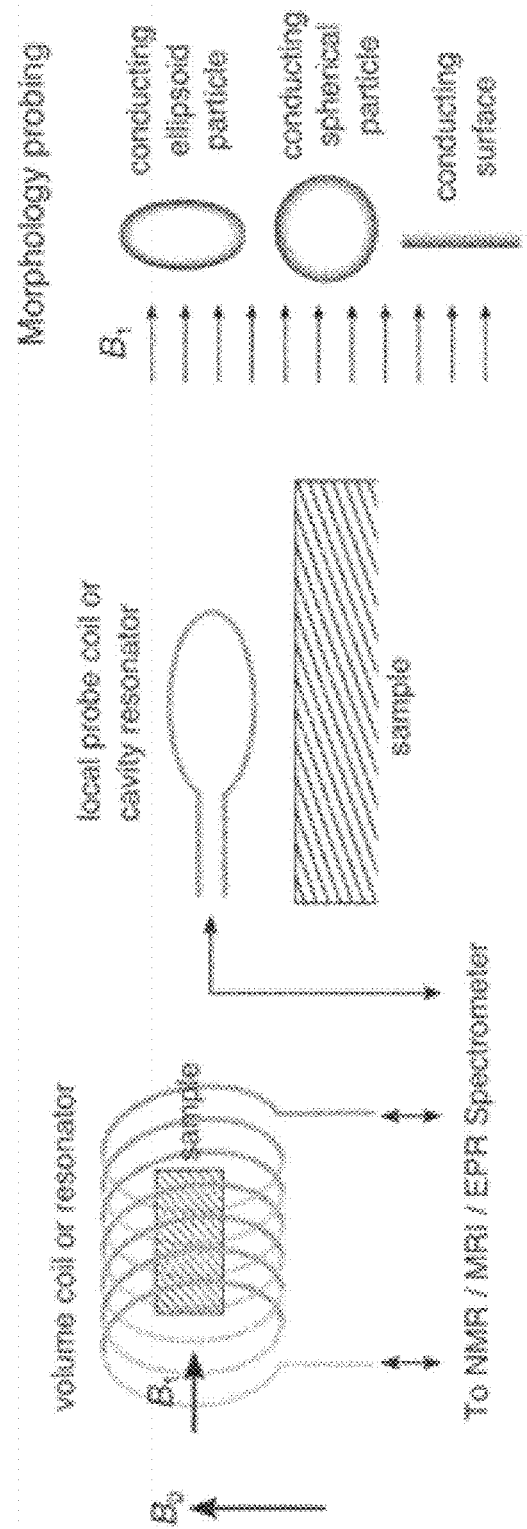

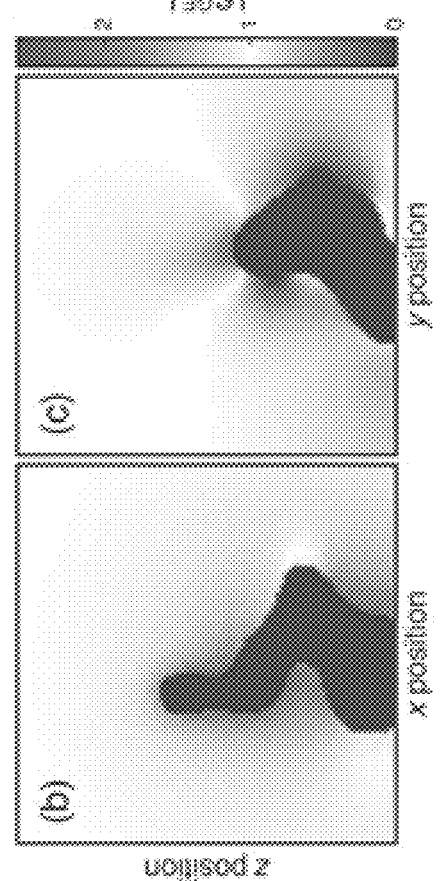
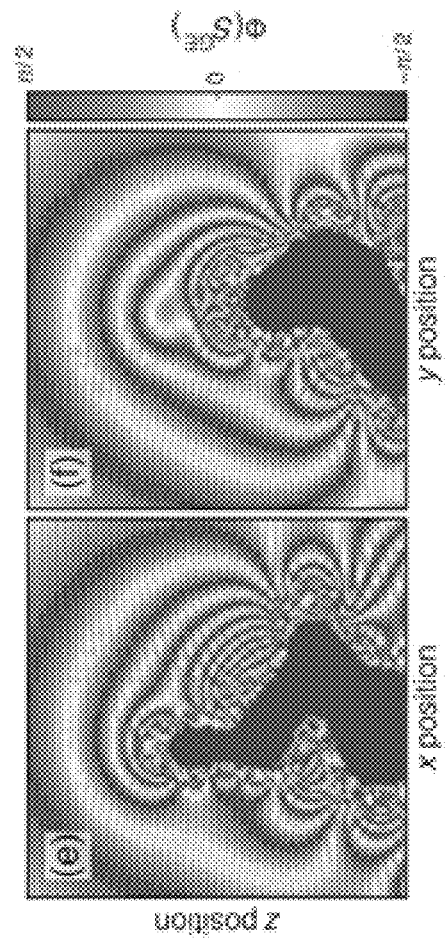
Fig. 11A
Fig. 11B
Fig. 11C
Fig. 11D
Fig. 11E
Fig. 11F

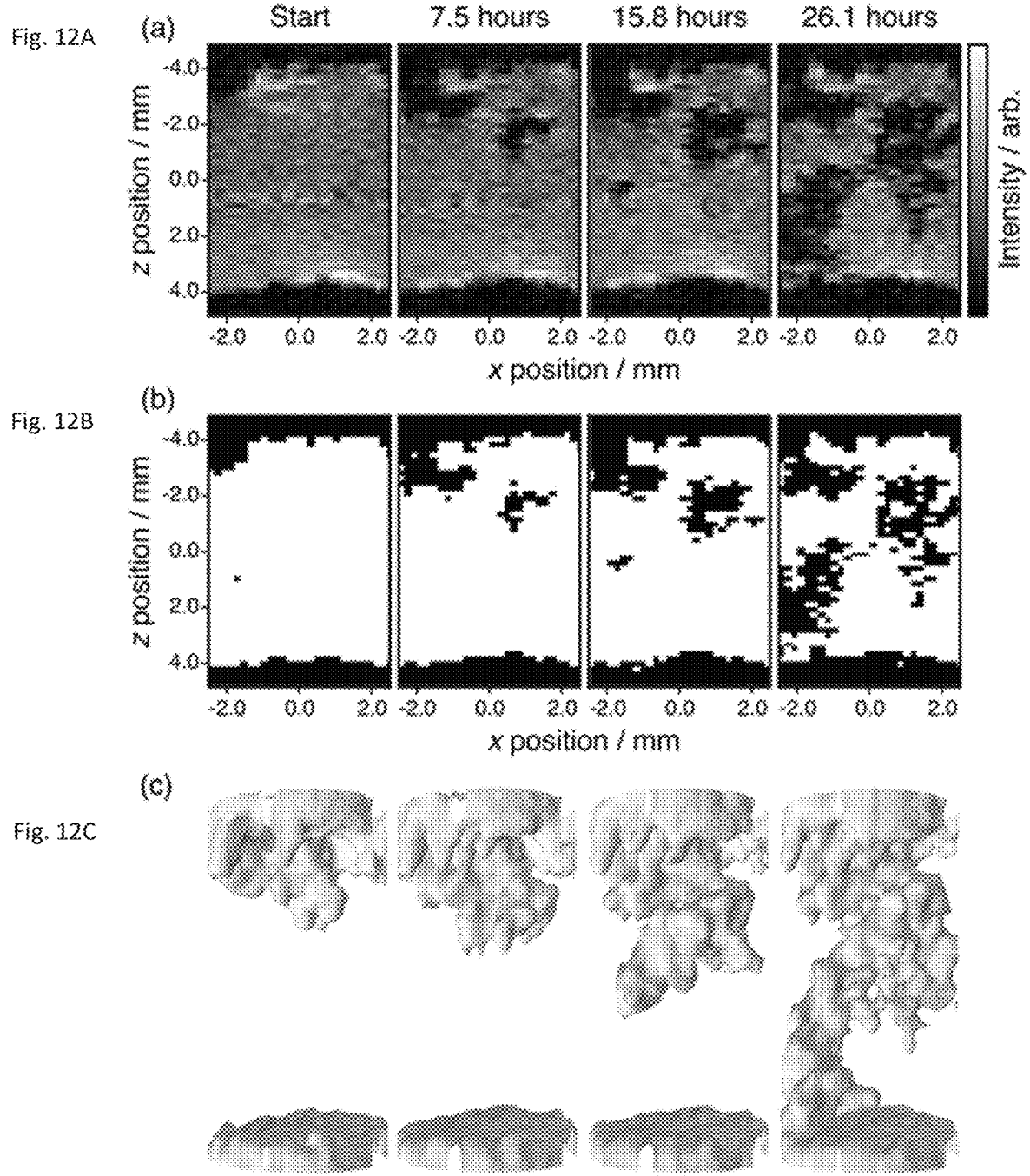

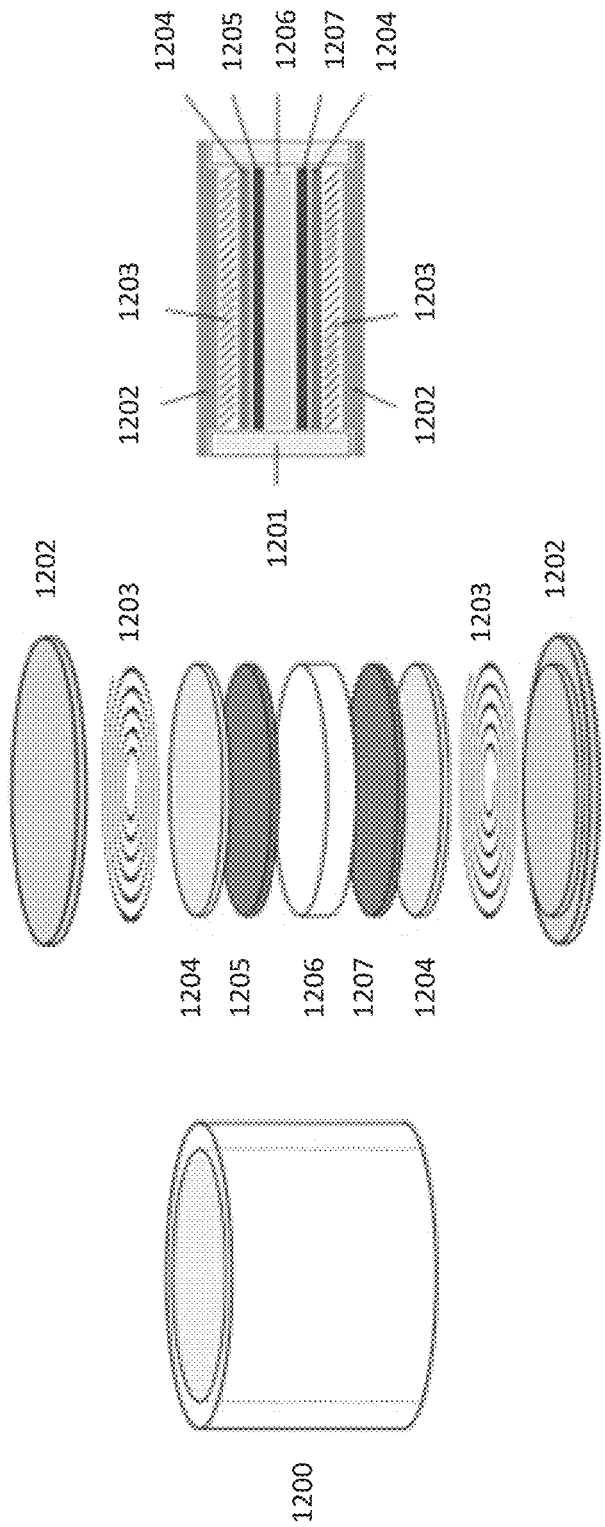

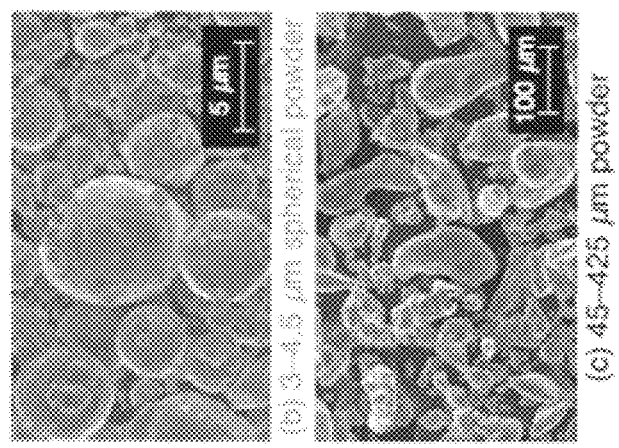
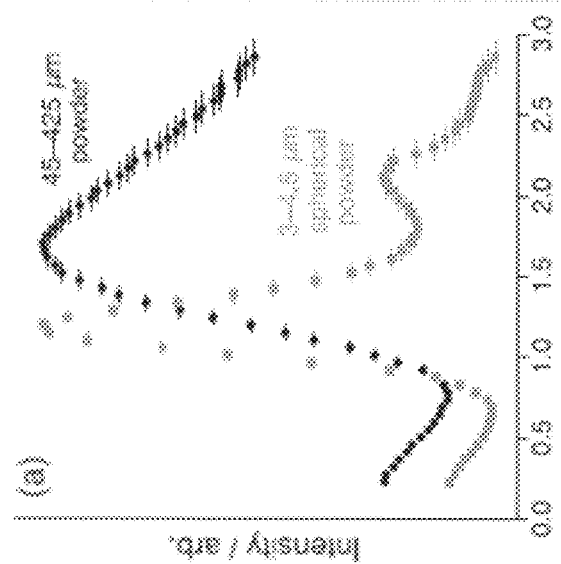
FIG. 16A  FIG. 16B  FIG. 16C

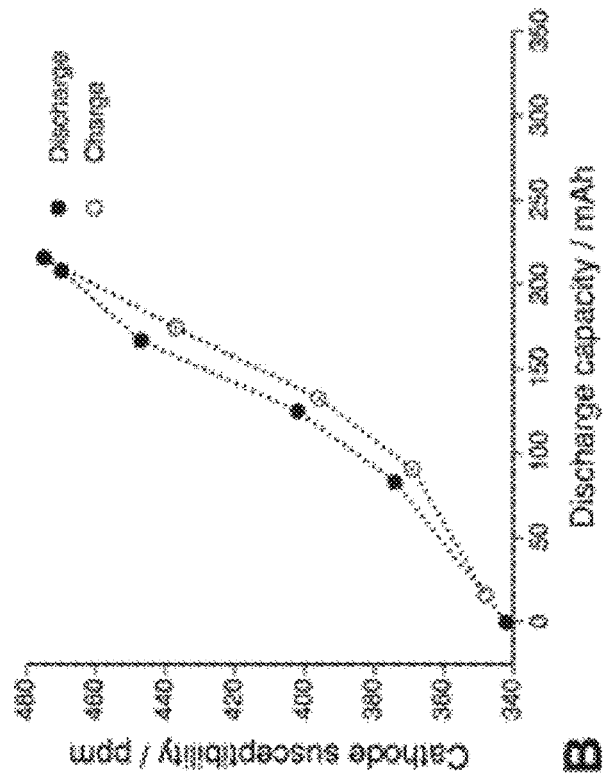
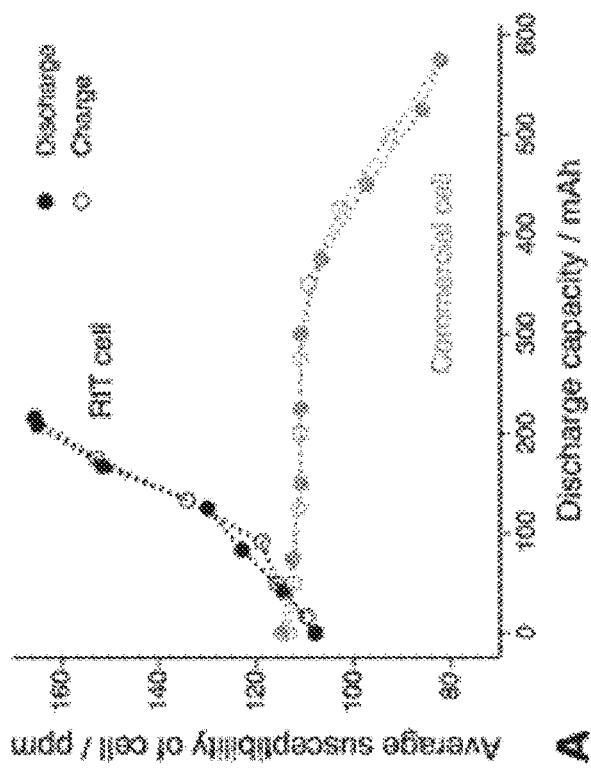
FIG. 25B
FIG. 25A

SYSTEMS AND METHODS FOR SUPER-RESOLUTION SURFACE-LAYER MICROSCOPY USING MAGNETIC RESONANCE

CROSS-REFERENCE TO RELATED APPLICATIONS

This application claims priority from U.S. Provisional Application No. 62/431,075, filed Dec. 7, 2016, incorporated herein by reference in its entirety for all purposes, and is a continuation-in-part of International Patent Application No. PCT/US2016/027624, filed Apr. 14, 2016, which claims priority from U.S. Provisional Application No. 62/149,159, filed Apr. 17, 2015, all of which are incorporated herein by reference in their entireties for all purposes.

STATEMENT OF GOVERNMENT INTEREST

The United States Government has rights in the invention described herein pursuant to the award CHE-1412064 from the US National Science Foundation.

FIELD OF THE INVENTION

The present invention generally relates to super resolution microscopy. In particular, the present invention relates to super-resolution microscopy using magnetic resonance. This application also generally relates to detecting physical and chemical changes in conducting structures. In particular, this application relates to using magnetic resonance to indirectly measure internal characteristics of a conducting structure. The conducting structure may be a battery, a capacitor, a supercapacitor, a fuel cell, or a catalyst material.

BACKGROUND

Resolution of items beyond the limits of optical microscopes due to the diffraction of light has become increasingly important. However, such "super resolution" microscopy techniques have proven lacking in application to certain subjects.

However, techniques have been developed for determining properties for a subject, for example Magnetic Resonance is used for conductive regions. The spatial resolution of traditional Magnetic Resonance Imaging (MRI) techniques is typically dictated by the strength of the applied magnetic field gradients, resulting in hard resolution limits of the order of 20-50 µm in favorable circumstances. Imaging using Magnetic Resonance (MR) techniques has typically relied on the ability to encode spatial information in the frequency or phase of the precessing nuclear spins. In MRI, this process is achieved through the application of magnetic field gradients, which has led to a plethora of applications in the health field and in the materials sciences alike. The resolution limit in conventional MRI is often hardware-related. For clinical MRI, for example, this limit is typically dictated by the maximum gradient strength. Intrinsic sample properties, such as chemical shift dispersion or fast relaxation, particularly in rigid samples, are further frequently-encountered constraining factors.

The spatial variation of the radiofrequency (rf) field has also been used to perform imaging using nuclear spins. In the most straightforward case, spatially resolved information can be obtained from a given volume of a sample by placing it within a coil region with large rf field variations. Surface coils are particularly useful in this regard as they have a well-defined rf field profile that can penetrate the surface region of a sample to yield localized spectroscopic information, with clear uses for in vivo applications. Classes of 'depth pulses' and pulse sequences were later developed to be used in conjunction with surface coils to further enhance the spatial selectivity. These experiments form part of a larger class of MR imaging methods that can be used to study planar samples.

In magnetic resonance imaging, localization is performed with the help of magnetic field gradients. In conductors, there is an intrinsic spatial dependence of the rf field due to induced eddy currents on the surface of the object that oppose the propagation of the wave into the medium. Electromagnetic radiation decays exponentially when it enters a conducting region with a characteristic length, called the skin depth, $$\delta = \sqrt{\frac{1}{\pi\mu\nu\sigma}} \quad \text{(Equation 1)}$$

where $\nu$ is the frequency of the field, $\mu$ the permeability of the conductor and $\sigma$ its conductivity. This effect has profound implications for the sensitivity of magnetic resonance (MR) techniques, which rely on radio frequency (rf) fields to excite and detect precessing spins from within conducting regions.

A key feature Equation 1 above is the dependence on $\nu^{-1/2}$ which means that at higher frequencies (corresponding to experiments performed at higher magnetic fields) $\delta$ is reduced. For example, $\delta$=12.3 µm for nuclear spins of Lithium-7 ($^7$Li) in metallic lithium at a magnetic field of a 9.4 T (larmor frequency, $\nu_n$=155 MHz) while Lithium-6 ($^6$Li) nuclei in the same sample will have a larger effective skin depth, $\delta$=20.0 µm because of the lower gyromagnetic ratio of this isotope and therefore lower larmor frequency ($\nu_n$=59 MHz). For a corresponding electron spin transition, GHz frequencies would be relevant, and the skin depth would be in the range $\delta \approx 1$ µm.

Studying commercial battery designs under their typical operating conditions using conventional analytical tools has proven to be very difficult due to the large size, complicated structure and material properties of these devices. Due to these limitations, most studies have been restricted to specialized cell designs with properties amenable to study using specific techniques. These restrictions have meant that the investigation of performance and failure mechanisms in batteries is still performed destructively by cycling multiple cells and taking them apart at critical points to analyze changes that have occurred. This process involves considerable time, effort and expense. Moreover, physical and chemical changes occurring when the cell is taken apart can compromise any information obtained.

Batteries are a crucial enabling technology in many important energy solutions integral to advances in portable electronics, electric vehicles and grid storage. Continued demand for batteries with high energy capacity and the desire to quickly charge and discharge the devices present a number of formidable engineering and scientific challenges. Ensuring device safety is an important consideration, which needs to be addressed with care. Several industry leaders have experienced unforeseen setbacks due to battery and cell malfunctions, such as most recently, for example, seen in the Samsung Note 7 devices or in the iPhone 8 swelling issues. One major reason for the recurrence of such problems, and for the slow progress in battery technology is the difficulty in tracking defects inside the cells during operation in a nondestructive fashion.

X-Ray CT is a successful technique for scanning electrochemical cells, but it is relatively slow, and thus usually not applicable for high throughput or in situ applications. Furthermore, X-Ray CT provides diagnostics mostly of the denser components of a cell, and does not offer insights into subtle chemical or physical changes of the materials inside. A recently-developed acoustic technique appears to be a highly promising methodology for the non-destructive characterization of cell behavior throughout the cell life, and is currently being investigated for its sensitivity to important cell behavior.

Magnetic Resonance (MR) techniques have been developed to measure several different cell properties. A fundamental limitation that is difficult to overcome under typical operating conditions is that conductors are not transparent to rf irradiation. Often the cell casing is made of conductive material, such as polymer-lined aluminum in pouch or laminate cells, but also the electrodes preclude the use of conventional MR for realistic or commercial-type cell geometries. Nonetheless, MR has provided important insights into electrolyte behavior, Li-dendrite growth, and other electrochemical effects by the use of custom-built cells, which allow convenient rf access.

The prospect of applying magnetic resonance techniques (e.g., NMR and MRI) to commercial batteries is restricted because almost every cell design is encased in a conductive material, for example, solid stainless steel, aluminum, aluminum-laminated films used in pouch cells, etc. The radiofrequency (rf) fields used in typical magnetic resonance experiments are incapable of penetrating the conductive material (i.e., metallic layer) in order to excite and detect the nuclear magnetization.

A need exists for improved technology including a microscopy technique that exploits the intrinsic changes imparted on the rf field when it enters a good conductor, rather than using intrinsically designed magnetic field profiles or stray magnetic field gradients. Conducting systems offer unique challenges compared to those tackled by the 'depth pulse' and related techniques described above, due to the fast T1 and T2 relaxation of the nuclear spins and the intrinsic shape of the rf field profile. Embodiments of the present application, termed Slice Microscopy in Conductors (SMC), exploit these traits and provide the ability to select slices within the objects. A need also exists for improved technology capable of applying magnetic resonance techniques to measure physical and chemical changes in conducting structures, including batteries encased in a conductive material.

SUMMARY

In one implementation, the disclosure describes a method of probing the layers above, at, and below the surface of a conducting region. The nuclear or electronic spins present in a conductive region are excited by a frequency. A frequency is then detected from the conducting region. Using the conductivity of the conducting region, the frequency used to excite the nuclear or electronic spins, and the frequency that is detected, the length scales are determined. The depth profile of the conducting region can then be obtained.

In another implementation, the disclosure describes a method of applying a pulse sequence to a conducting region. The pulse sequence is comprised of several rf pulses and delays and results in impregnating the conducting region with a pattern of z-magnetization. A detector can than read out the pattern of z-magnetization.

In one implementation, a method of diagnosing a conducting structure includes providing the conducting structure in a magnetic field, immersing the conducting structure in a detection medium, exciting nuclear or electronic spins within the detection medium using a first frequency, receiving a second frequency from the detection medium, obtaining a frequency distribution of the detection medium, and indirectly measuring internal characteristics of the conducting structure by characterizing frequency changes in the frequency distribution. The conducting structure may be a battery, a capacitor, a supercapacitor, a fuel cell, or a catalyst material.

In another implementation, a method of diagnosing a conducting structure includes providing the conducting structure in a magnetic field, providing a sample including a detection medium at a predetermined distance from the conducting structure, exciting nuclear or electronic spins within the detection medium using a first frequency, receiving a second frequency from the detection medium, obtaining a frequency distribution of the detection medium, and indirectly measuring internal characteristics of the conducting structure by characterizing frequency changes in the frequency distribution. The conducting structure may be a battery, a capacitor, a supercapacitor, a fuel cell, or a catalyst material.

In a further implementation, a system for diagnosing internal characteristics of a conducting structure includes an NMR/MRI magnet, at least one radiofrequency coil removably positioned within the NMR/MRI magnet, a holder configured to receive a conducting structure, and a detection medium. The internal characteristics of the conducting structure are indirectly measured by exciting nuclear or electronic spins within the detection medium using a first frequency, receiving a second frequency from the detection medium, obtaining a frequency distribution of the detection medium, and characterizing frequency changes in the frequency distribution. The conducting structure may be a battery, a capacitor, a supercapacitor, a fuel cell, or a catalyst material. The holder containing the conducting structure may be provided inside of the detection medium or at a predetermined distance outside of the detection medium.

In yet another implementation, a system for diagnosing internal characteristics of a conducting structure includes a holder configured to receive a conducting structure; a plurality of containers arranged in three dimensions around the holder and a predetermined distance from the holder, each container housing a volume of a detection medium; a plurality of radiofrequency coils, each radiofrequency coil surrounding a container; and a plurality of detection circuits, each detection circuit connected to a radiofrequency coil. Internal characteristics of the conducting structure are indirectly measured by acquiring an NMR chemical shift spectrum to estimate a change in a magnetic field in a vicinity of each container housing the detection medium to generate an overall field map and fit the overall field map against a calculated susceptibility distribution. The conducting structure may be a battery, a capacitor, a supercapacitor, a fuel cell, or a catalyst material.

It would be useful to achieve resolution along one or more imaging dimension exceeding typical resolution limits of even magnetic resonance imaging (MRI) machines. The concepts discussed can be extended to other microscopy, including optical microscopy.

BRIEF DESCRIPTION OF THE FIGURES

The foregoing and other objects, aspects, features, and advantages of the disclosure will become more apparent and better understood by referring to the following description taken in conjunction with the accompanying drawings, in which:

FIGS. 10A-C illustrate one embodiment of an MRI setup: FIG. 10A illustrates the rf coil or resonator covers the full sample volume, and surface layers of the conducting region are probed by the pulse sequence. In addition morphological details are probed above the surface via the susceptibility differences between the materials. FIG. 10B illustrates the coil or resonator can be situated above the surface and scan the surface of the material in a setup similar to atomic force microscopy or magnetic resonance force microscopy. The local surface layers are probed by the pulse sequences described. FIG. 10C illustrates morphological details are obtained by (a) probing the surface penetration of the electromagnetic fields and using the pulse sequences (b) probing morphology is also performed by visualizing the changes above the surface.

FIGS. 11A-F illustrate a demonstration of frequency changes around a conducting microstructure region, calculated via finite element methods. The histogram shows the frequency distributions.

FIGS. 12A-C illustrate In situ $^1H$ 3D FLASH imaging results from the electrochemical cell charged at 160 µA. FIG. 12A shows 2D slices from four time points, FIG. 12B shows segmented images of the results from FIG. 12A where $I_{threshold}=0.2I_{max}$, FIG. 12C shows 3D segmented images of the same time points with an additional Gaussian filter applied to smoothen the visualization.

FIGS. 13A-C show the geometry of a commercial coin cell, but with the side casing made of non-conducting material.

FIG. 15A shows raw magnitude and phase data obtained by varying k (by changing $\tau$) in the pulse sequence with N=16, $\Delta=800$ µs, and $\tau(\pi$-pulse$)=16$ µs for k=1, as calibrated on 1M LiCl (aq). The intensity of the on-resonance position in the spectrum is plotted. The simulated data are taken from the sum over all depths. FIG. 15B shows error bars are derived from the errors in the pulse calibration (0.25 µs error assumed on the calibrated $\pi/2$ pulse) and NMR signal intensities (taken as the standard deviation of the noise in each spectrum). Where errors are not visible they fall within the marker size. The asterisks indicate a jump due to the additional overtone signal at k=3 and $r=\delta \ln 3 \approx 12$ µm.

FIG. 16A shows experimental results obtained on powdered aluminum samples by varying k (using a fixed pulse width, $\tau_{\pi/2}=11$ µs and changing the pulse power, with the k=1 pulse power calibrated with a 1 M $Al(NO_3)_3$ solution) with N=8 and $\Delta=80$ µs. The intensities of the on-resonance positions in the spectra are plotted. Error bars are calculated following the methodology described in FIG. 15. Where errors are not visible, they fall within the marker size. FIGS. 16B and 16C show SEM images of the two samples. The second peak at higher k-value for the smaller particles is likely a consequence of the n=2 overtone signal, which is due to the fact that the particle size is $<\delta/4$. As a result, signals from regions experiencing a readout pulse slightly larger and smaller than $\pi$ do not cancel each other completely.

FIG. 17A illustrates a poach cell battery. FIG. 17B illustrates a holder that housing a detection medium and keeps the battery of FIG. 17A in place relative to the detection medium. FIG. 17C illustrates a cross-section through the holder showing a first detection medium chamber, a second detection medium chamber, and a battery chamber. FIG. 17D illustrates the battery and holder of FIGS. 17A and 17B disposed within a radiofrequency coil positioned at an isocenter of an NMR/MRI magnet. The relative orientations of the $B_0$ and $B_1$ fields are shown relative to the object geometry in FIG. 17C, with $B_1$ aligned with the major face of the pouch cell.

FIG. 25A shows fitted magnetic susceptibilities of the cell during the discharge/charge. For simplicity, the cell is assumed to have an average volume susceptibility. Error bars are smaller than the size of the points. FIG. 25B shows the average susceptibility of the cathode material. The susceptibility values are given in ppm indicating a factor of $10^{-6}$.

Figure 1:
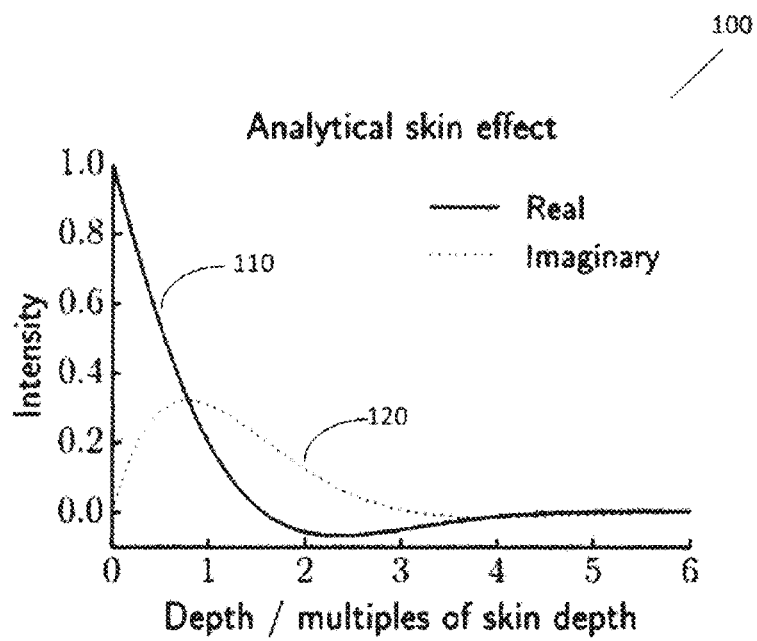
FIG. 1 illustrates the form of the analytical skin depth equation in the rotating frame. The field at the surface is assumed to be $B_0=1+0i$.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Magnetic Resonance ("MR") studies of metals have emerged, largely due to applications in battery systems, where insight into the processes occurring on the metal surface is sought. Described herein are systems and methods utilizing the skin effect to provide an advantage by ensuring that all the detected signal originates from the area of interest: the surface.

One implementation described in the present disclosure relates to a methodology by which the skin effect can be exploited in order to excite and detect spins at specific depths within a conductor, with a selectivity of approximately $0.25\delta$. This technique allows the acquisition of a depth profile of a conductor with a resolution far exceeding that of any MRI experiment and without the use of external magnetic field gradients, thus it is appropriately called a super-resolution methodology. Furthermore, the sequence can be combined with other MR sequences or imaging techniques to take depth-dependent measurements.

At the heart of these super-resolution techniques lie not just the principle of reciprocity as formulated within the context of magnetic resonance, but also the specific dependence of the signal phases in response to propagation within conductive media.

Signal Detection in Magnetic Resonance: The Principle of Reciprocity

The orthogonal components of the applied radiofrequency field, $B_{1x}$ and $B_{1y}$ (where the bold notation signifies a complex quantity), can be used to define the rf field in the rotating frame of the nuclear spins, $$\tilde{B}_1^+ = \tfrac{1}{2}(B_{1x} + B_{1y}), \qquad \text{(Equation 2)}$$

$$\tilde{B}_1^- = \tfrac{1}{2}(B_{1x} - B_{1y})^*, \qquad \text{(Equation 3)}$$

where $\tilde{B}_1^+$ is the field in the positively rotating frame, and $\tilde{B}_1^-$ is the field in the negatively rotating frame.

Given an equilibrium magnetization, $M_0$, and an rf field as indicated by the equations above for a duration $\tau$, the complex transverse magnetization in the positive rotating frame becomes $$\tilde{M}^+ = M_0 \sin(\gamma\tau|\tilde{B}_1^+|)\frac{-i\tilde{B}_1^+}{|\tilde{B}_1^+|}, \qquad \text{(Equation 4)}$$

where $\gamma$ is the gyromagnetic ratio, $\tilde{M}^+$ and represents the x and y components of the magnetization in the rotating frame, $\tilde{M}^+ = \tilde{M}_x + i\tilde{M}_y$.

The detected signal arises from the induced magnetic flux at the detection coil by the precessing spin magnetization. For reciprocity to hold, the strength of this signal has an added dependence on the intrinsic sensitivity of the coil, which is represented by the field in the negatively rotating frame produced by a unit current in the coil, $\tilde{B}_1^{-*}$. The voltage induced in the coil is, $$\epsilon = 2\omega \tilde{M}^+ \tilde{B}_1^{-*}. \qquad \text{(Equation 5)}$$

This quantity multiplied by $e^{i\omega t}$ (and $e^{t/T_2^*}$) gives the form of the acquired signal in the laboratory frame as a function of time.

Skin Effect in Conductors

When incident on a conductor, the magnitude of the rf field is attenuated while the phase of the wave is also modified at different depths, $$B = B_0 e^{-\beta \bar{n}\bar{r}} e^{i\alpha\bar{n}\bar{r} - i\omega t}, \qquad \text{(Equation 6)}$$

where $\alpha$ and $\beta$ are the real and imaginary parts of the wave vector, $k = \alpha + i\beta$, whose full form is given by, $$\left.\begin{array}{c}\alpha\\\beta\end{array}\right\} = \sqrt{\mu\varepsilon}\,\frac{\omega}{c}\left[\frac{1}{2}\sqrt{1+\left(\frac{2\sigma}{\nu\varepsilon}\right)^2} \pm \frac{1}{2}\right]^{\frac{1}{2}}, \qquad \text{(Equation 7)}$$

where $\varepsilon$ is the dielectric constant of the conductor and $c$ is the speed of light in a vacuum. For a good conductor $$\left(\frac{2\sigma}{\nu\varepsilon}\right) \gg 1 \text{ and } \alpha \approx \beta(=1/\delta),$$

the inverse of the skin depth constant as defined by Equation 1), resulting in the same depth-dependence for both the phase and amplitude of the wave. For reference, for lithium metal, $\sigma = 1.08 \times 10^7$, $\varepsilon = \varepsilon_r\varepsilon_0 = (1+\chi)\varepsilon_0 \approx (1+2\times 10^{-5}) \times 8.9 \times 10^{-12}$, which comfortably places it as a good conductor at typical nuclear magnetic resonance (NMR) or electron spin resonance (ESR) frequencies.

When $\bar{n}$ and $\bar{r}$ are parallel for wave propagation into the surface, Equation 6 becomes $$B = B_0 e^{-\beta r} e^{i(\beta r - \omega t)}. \qquad \text{(Equation 8)}$$

While the amplitude of the field is attenuated according to $e^{-\beta r}$, the phase at a given depth is proportional to $\beta r$.

If observing only the signal from the conductor, then Equation 8 can be considered as describing the $B_1$ field, and the x, y subscripts can be dropped by ensuring that $B_1$ is aligned with the surface of the conductor. The expressions for the positively and negatively rotating frame become $$\tilde{B}_1^+(r) = B_0 e^{-\beta r} e^{i\beta r}, \quad \text{(Equation 9)}$$

$$\tilde{B}_1^-(r) = (B_0 e^{-\beta r} e^{i\beta r})^*, \quad \text{(Equation 10)}$$

$$|\tilde{B}_1^+(r)| = |B_0| e^{-\beta r}, \quad \text{(Equation 11)}$$

where, for convenience, the factor of ½ in Equations 2 and 3 has been absorbed by the $B_0$ term.

The form of $\tilde{B}_1^+(r)$ is shown in FIG. 1, which shows the form of the analytical skin depth equation in the rotating frame 100. The field at the surface is assumed to be $B_0 = 1 + 0i$. The real component 110 is graphed using a solid line. The imaginary component 120 is graphed using a dashed line.

Substituting the expression for $\tilde{B}_1^+(r)$ into Equation 4 gives the flipped magnetization at each depth, $$\tilde{M}^+(r) = -i \frac{M_0 B_0}{|B_0|} e^{-i\beta r} \sin(\gamma \tau |B_0| e^{-\beta r}), \quad \text{(Equation 12)}$$

and the voltage induced in the detection coil is given by the integral of the contributions from each depth, scaled by the detection signal strength which is also depth dependent:

$$\epsilon = -2i\omega \frac{B_0^2}{|B_0|} M_0 \int_{r=0}^{\infty} e^{2i\beta r} e^{-\beta r} \sin(\gamma \tau |B_0| e^{-\beta r}) dr. \quad \text{(Equation 13)}$$

The time dependence would be obtained by multiplying by $e^{i\omega t}$ (and $e^{t/T_2^*}$) as before.

There are some key aspects of this expression that have many implications for the MR signal acquired from conductors. Firstly, the $e^{-\beta r}$ term inside the integral scales the signal acquired at higher r (deeper into the conductor). Similarly, the $e^{2i\beta r}$ term ensures that the relative phase of the acquired signal is proportional to the depth, this term governs the extent of constructive or deconstructive interference between the signals from different depths during a given excitation. Finally, the $e^{-\beta r}$ term inside the sine function governing the nutation of the magnetization in the rotating frame ensures that spins at each depth are flipped by a different angle, as discussed below.

Nutation: Simulation and Experiment

The effects implied by Equation 13 have a direct impact on signal quantification, but a much more sensitive measure of the full form of the equation and therefore a method by which to validate reciprocity, is a nutation experiment in which the signal is measured as a function of the excitation pulse duration, $\tau$.

Figure 2:
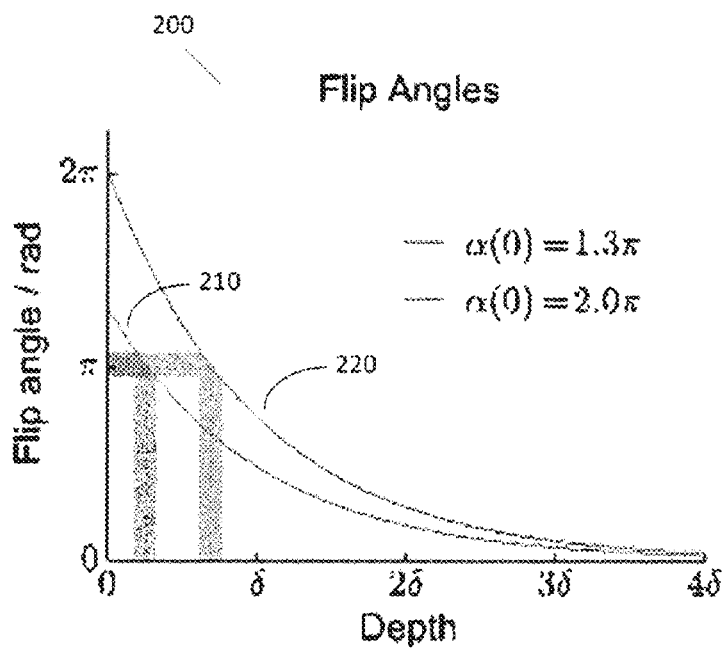
FIG. 2 illustrates the changing flip angle as a function of the depth in a conductor.

In the vector model, the flip angle, $\alpha$, is defined as the angle through which the bulk magnetization vector is rotated by the rf field. In a conductor, this equates to the quantity inside the sine term in Equation 12, and it is depth dependent, $$\alpha(r) = \gamma \tau |B_0| e^{-\beta r}, \quad \text{(Equation 14)}$$

so that for a given rf field strength, $|B_0|$, and duration, $\tau$, magnetization at each depth in the conductor will be excited by a different flip angle. This effect is illustrated in FIG. 2. The depth-dependence of the phase will not impact the flip angle, but will change the relative size of the x and y components of $\tilde{M}^+$ at each depth. The acquired NMR signal is a sum over the signals from every depth and the phase of the excited magnetization is crucial in determining the overall sum. Only by comparing the relative signal intensities at different flip angles can the effect of the phase be judged. Described herein is a nutation experiment in which signal is acquired for multiple values of $\tau$.

FIG. 2 shows an illustration of the changing flip angle as a function of the depth in a conductor. The position corresponding to a $\pi$ pulse is indicated for two cases with differing flip angles at the surface. The line 210 corresponding to a starting angle of $1.3\pi$ is shown. The line 220 corresponding to a starting angle of $2.0\pi$ is similarly shown.

Figure 3:
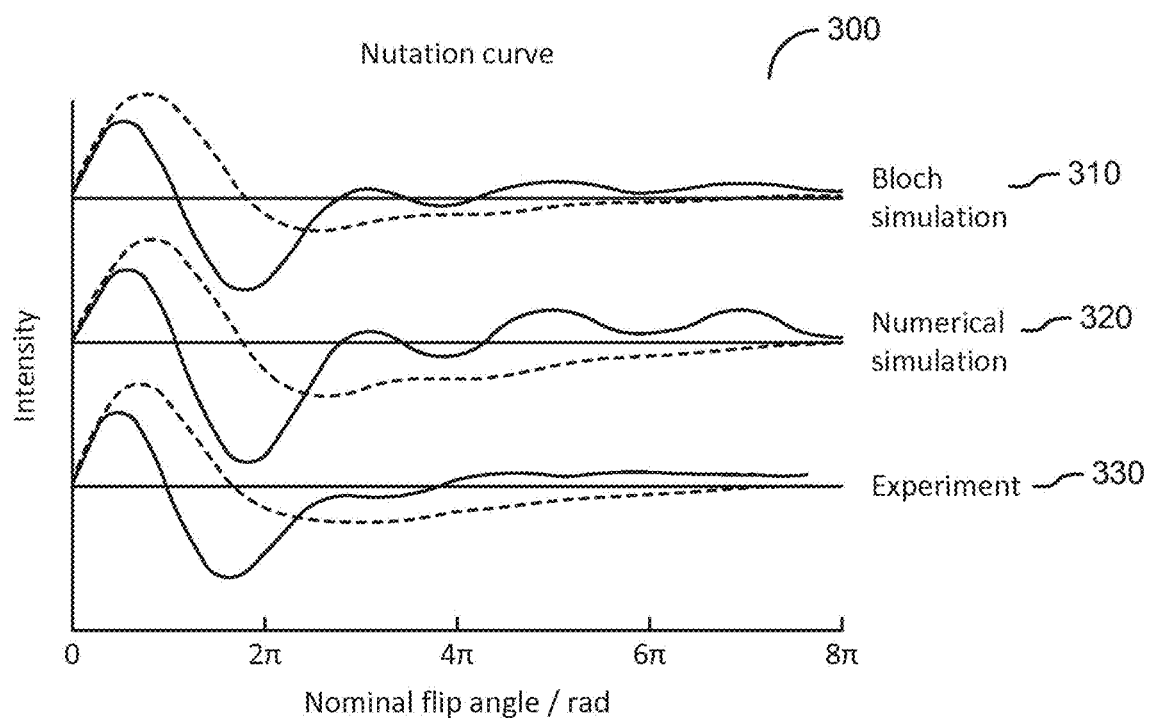
FIG. 3 illustrates a graph of an experimental $^7Li$ nuclear magnetic resonance nutation curve for a lithium metal strip plotted alongside a numerical solution and a solution that solves the Bloch equations to include relaxation during the pulse.

An experimental $^7$Li NMR nutation curve 330 performed on a rectangular piece of natural abundance lithium metal (approximately 10×20×0.5 mm) is shown in FIG. 3 along with numerical simulations based on Equations 6-14. FIG. 3 shows a Bloch simulation plot 310 of a solution that solves the Bloch equations to include relaxation during the pulse. The flip angle defined by the x axis is calibrated to LiCl(aq) in the experimental curve and to $B_0$ in the calculated curves. The numerical simulation of Equation 13 plot 320 is also shown as well as the experimental $^7$Li NMR nutation curve 330 for a lithium metal strip. Solid and dotted lines for all plots represent the real and imaginary components of the nutation curves, with the solid lines representing the real components and the dotted lines representing the imaginary components.

The appearance of these curves 300 is very distinctive and contrast sharply with that expected for a liquid sample, where a damped, sinusoidal pattern would be observed (Equation 4). It is seen that there is excellent agreement between the experimental curve and the calculated ones, particularly at lower flip angles <$3\pi$ where the forms of both the real and imaginary signals are reproduced, as well as their relative magnitude. A slight offset is apparent in the position of the first minimum in the calculated curves that can be ascribed to slight deviations in flip angle calibration. Although, in the experiment LiCl(aq) is used for pulse calibration, it is expected that the field in close proximity to the metal surface is attenuated. A second discrepancy can be found at larger flip angles, where the experimental curve appears to be somewhat attenuated relative to the calculated curves. A simulation including relaxation effects during the pulse (top line) agrees better in these regions, but not completely, implying that relaxation effects cannot be the sole reason for this discrepancy. The remaining discrepancy could be explained by inhomogeneities in the rf field at the surface of the conductor which would mean that the result represents a superposition of nutation curves for a range of effective $B_0$ values, damping the oscillations in the curve at higher flip angles.

It is worth considering how the different terms in Equation 13 impact the nutation curve. Without the $e^{2i\beta r}$ term (which would be cancelled out if the complex conjugate of $\tilde{B}_1^-{}^*$ were not taken in Equation 13) there would be no depth-dependent phase and the real component of the induced voltage would always be zero (ignoring any off-resonance effects). A similarly incorrect nutation curve would also be obtained if the $e^{-\beta r}$ term were neglected by not taking into account the detection field; in this case the signal from within the metal would contribute more strongly, particularly when the flip angle near the surface is a multiple of $\pi$.

The sensitivity of the nutation curve to the formulation of the equation for the detected signal provides a practical proof of the theory of reciprocity. Moreover, this effect also confirms that the mathematical basis for understanding skin effects is accurate. This formalism opens up the possibility of designing more advanced pulse sequences to exploit the depth dependence of the rf to selectively probe different regions of the conductor.

Pulse Sequence: Depth Selective Saturation and Excitation in Conductors

Figure 4:
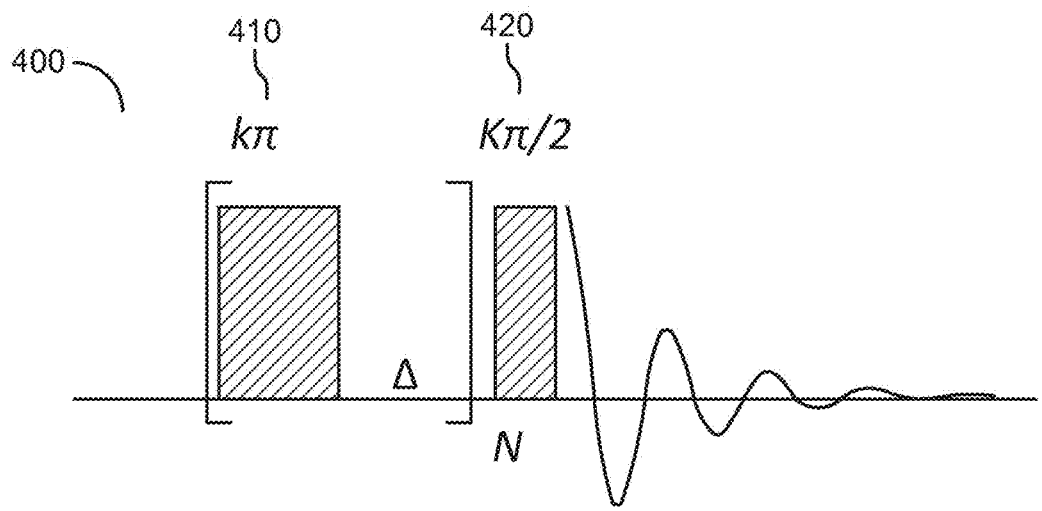
FIG. 4 illustrates a pulse sequence designed to selectively excite the magnetization at one value of r while saturating the magnetization at other depths.

FIG. 4 shows a pulse sequence 400 that, by exploiting the depth dependence of the flip angle (FIG. 2), can be used to selectively excite the magnetization at only one depth inside the conductor, while saturating the magnetization at other depths. The sequence consists of a chain of Nk$\pi$ pulses separated by time delays, $\Delta$ 410, followed by a readout k$\pi$/2 pulse 420. The value of k is chosen to adjust $\alpha(r=0)$, but only the selected magnetization at depths where $\alpha(r_{sel})=\pi$ is preserved after the initial pulse chain, as described below.

Figure 5:
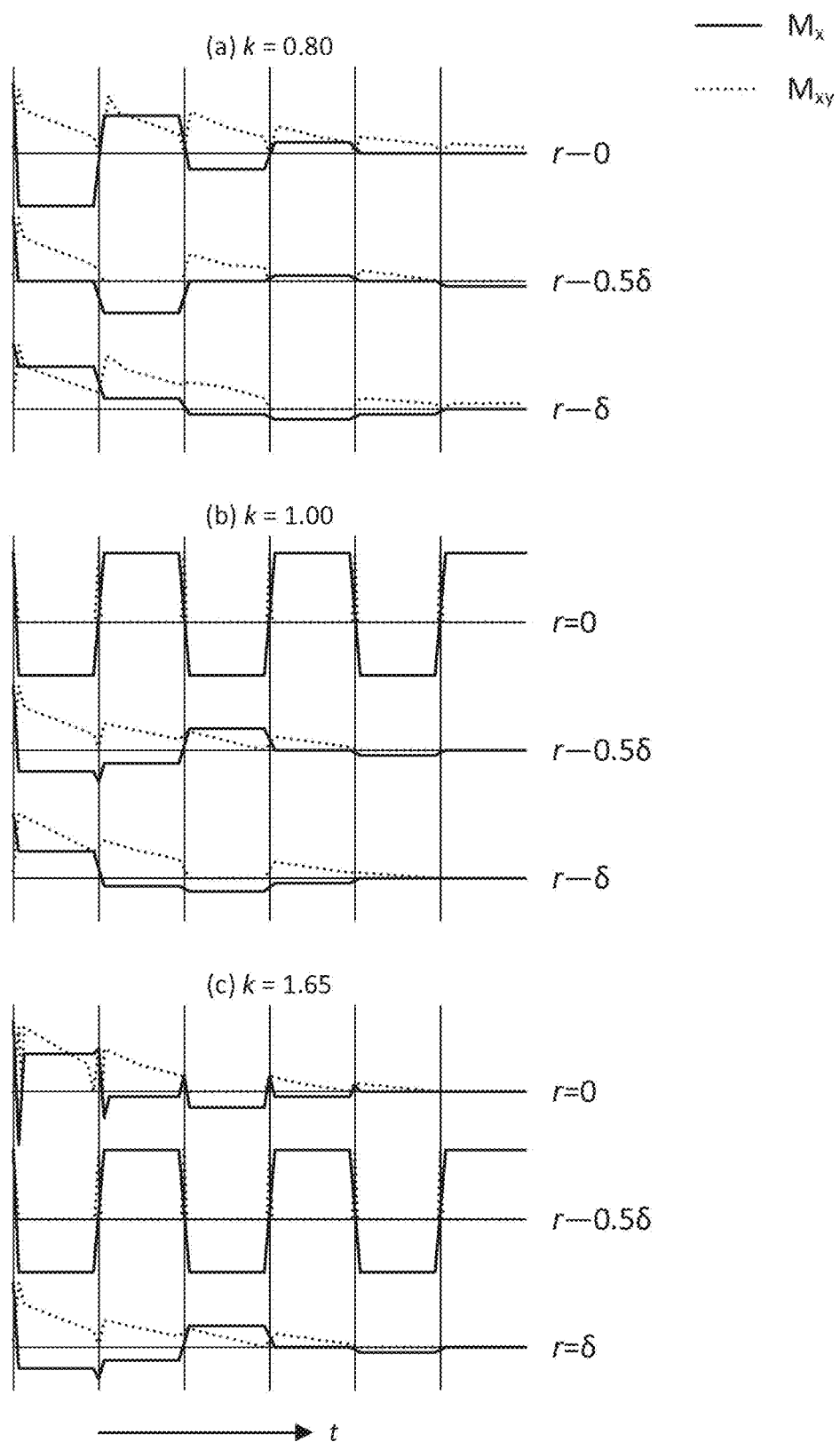
FIG. 5 illustrates plots for the solution of the Bloch equations for the $\pi$ pulse chain in the saturation pulse sequence with N=6 and variable k for $r=0$, $0.5\delta$, $\delta$.

FIG. 5 illustrates the solution of the Bloch equations for the $\pi$ pulse chain in the saturation pulse sequence with N=6 and variable k for r=0, 0.5$\delta$, $\delta$. $|M_{xy}|$ (dotted line) and $M_z$ (solid line) are plotted. The black regions indicate evolution under an rf pulse. Relaxation during the pulses is neglected, but would not produce sizable deviation.

FIG. 5 shows the effect that the $\pi$ pulses have on the magnetization at different positions in the conductor. When k=1 (FIG. 5, panel (b)) the magnetization at the surface (r=0) is initially inverted from its equilibrium state at $M_z=M_0$, $M_{xy}=0$ to $M_z=-M_0$, $M_{xy}=0$ and is in general stored along the z axis following each pulse. Therefore, during the evolution periods the magnetization is affected by the $T_1$ relaxation mechanisms only because $M_{xy}=0$, and when $T_1 \gg T_2$, as is the case for $^7$Li metal, to a good approximation, the magnetization in this region is preserved throughout the $\pi$ pulse chain. Due to the skin effect, regions away from the surface experience a damped $\tilde{B}_1^+$ field and so experience a reduced flip angle <$\pi$ (FIG. 2). The simulations for sites at r=0.5$\delta$, $\delta$ in FIG. 5, panel (b) illustrate the effect that this has; the magnetization is not stored along z, but has some xy component that quickly relaxes during the evolution periods. After multiple cycles of this process both the xy and z components of the magnetization are saturated, leaving signal from r=0 only. FIG. 5 (panels (a) and (c)) show that by changing k and therefore the flip angle at r=0, different positions in the metal are selectively excited or saturated. More specifically, for a given value of k only the signal at a selected depth where $\alpha(r_{sel})=\pi$ is preserved. That is, $\alpha(r_{sel})=\pi=k\pi e^{-\beta r_{sel}}$, from Eq. 14, giving $$r_{sel}=\delta \ln k, \quad \text{(Equation 15)}$$

where $\delta=1/\beta$.

Figure 6:
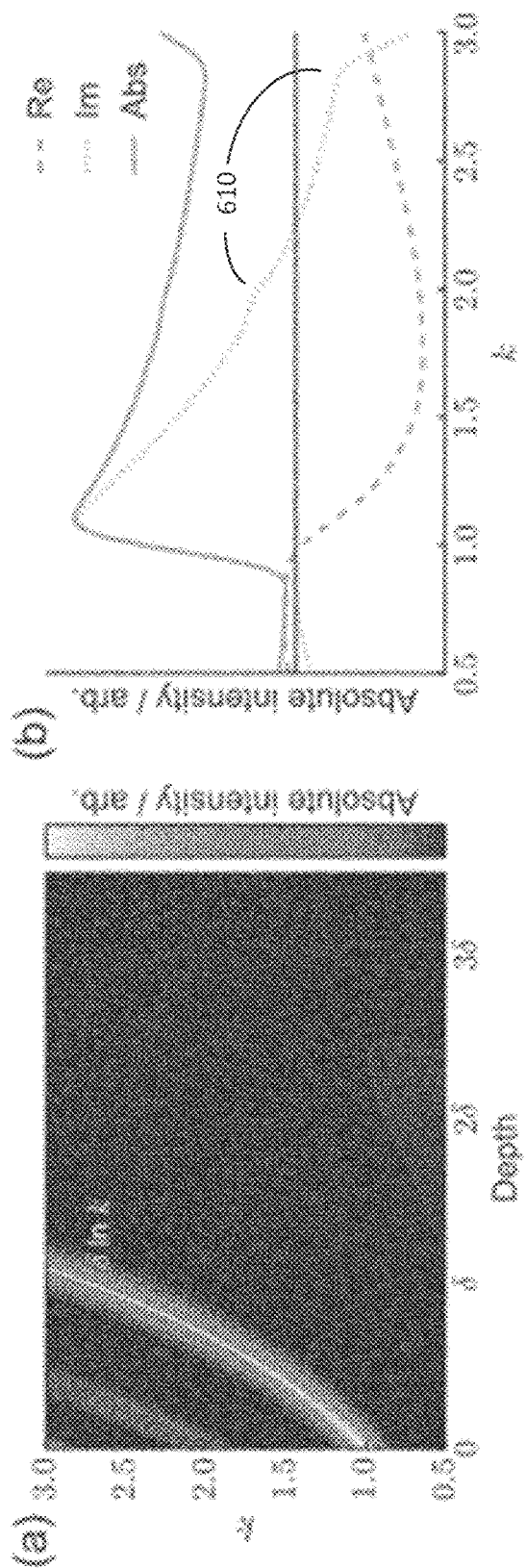
FIG. 6 illustrates simulation results of the sequence shown in FIG. 4 for different values of k, with N=16, $\Delta=800$ µs, $T_1=170$ ms and $T_2=500$ µs.

FIG. 6 illustrates simulation results 600 of the sequence shown in FIG. 4 for different values of k, with N=16, $\Delta$=800 $\mu$s, $T_1$=170 ms and $T_2$=500 $\mu$s. FIG. 6, panel (a) shows the absolute value of the detected signal at each depth. FIG. 6, panel (b) shows the summed signal over all the simulated depths As shown in FIG. 6, the full simulation for different k values at different depths (FIG. 6, panel (a)) demonstrates clearly that the dominant signal acquired for each k does occur around $\delta \ln k$ with a selectivity of ca. $\delta/4$ (3 $\mu$m for at 155 MHz). At k=2 there is an extra region of signal intensity at r=0 because the flip angle at the surface is close to 2$\pi$, so that the magnetization there is stored along +z during the saturation pulse chain and is preserved. However, the acquired signal intensity still remains low in this region because $\alpha_{readout}(r=0)=\pi$ and so the magnetization remains along $-z$ and is not observed, although regions close to r=0 where $\alpha_{readout}$ deviates slightly from $\pi$ do contribute some observable xy magnetization. This case will occur at all even values of k. A similar argument can also be followed for odd values of k>1, however in these regions the readout pulse is a multiple of $\pi/2$ so they contribute a large signal intensity to the overall sum. These effects are observed in FIGS. 6(a) and 6(b) where perturbations in the curve 610 are noticeable close to k=2 and 3. Their overall impact could be minimized by increased N or by implementing a phase cycle for the acquisition. Restricting experiments to k<2 would ensure that the region of interest is unambiguously defined and would still provide fine resolution of the surface sites in the conductor.

Figure 7:
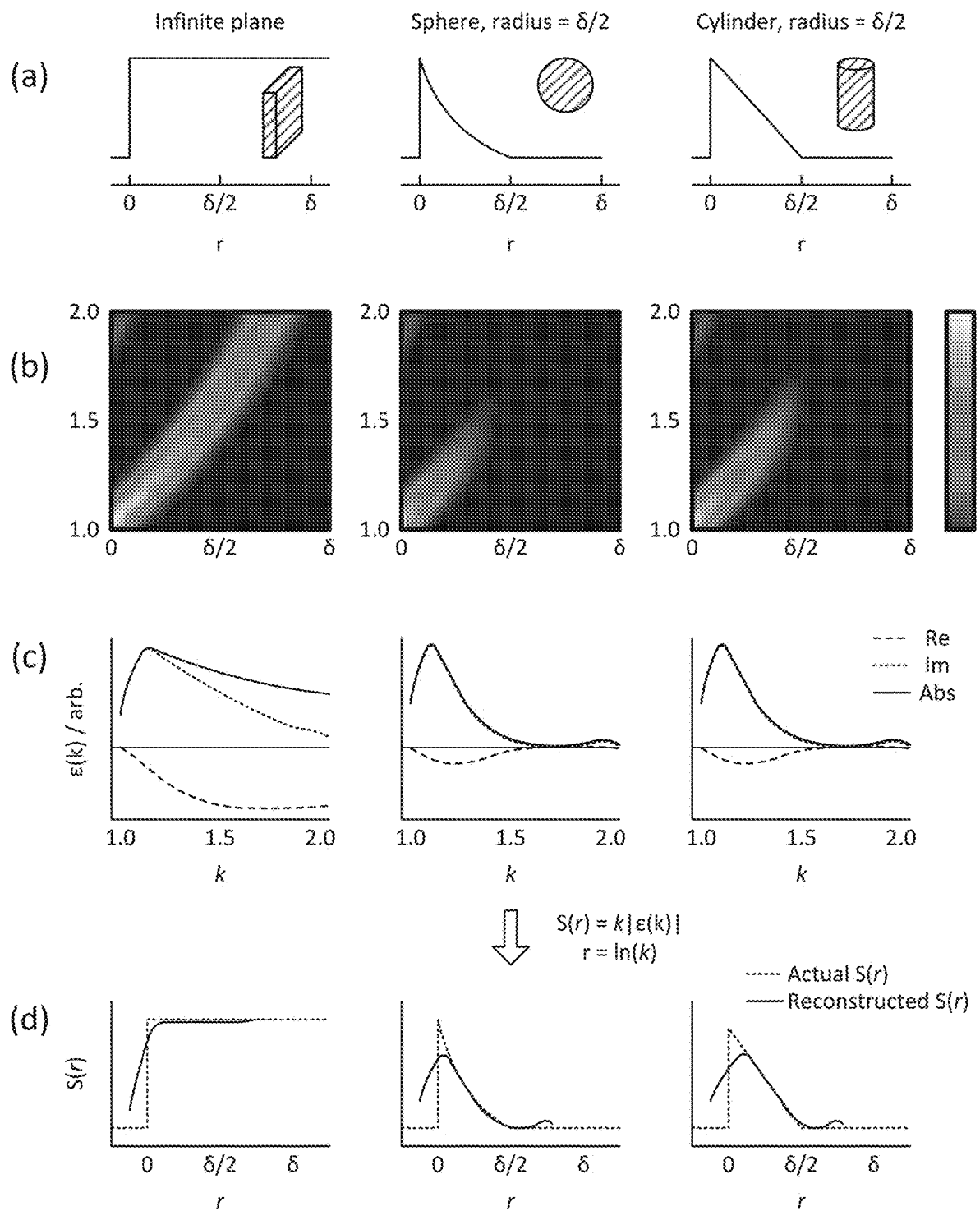
FIG. 7 illustrates a demonstration of the sequence results for samples of different shape.

FIG. 7 illustrates the demonstration of the sequence results for samples of different shapes. In FIG. 7, panel (a) shows the shape function assuming uniform density. FIG. 7, panel (b) shows simulated 2D profile for each shape showing signal intensity as a function of k and r. FIG. 7, panel (c) shows 1D profiles that could be measured experimentally by varying k. FIG. 7, panel (d) shows the transform of the simulated results from panel (c) to recover the underlying shape functions.

Until now the disclosure has focused on a sample with a uniform number of spins at each depth, corresponding to a planar surface with a thickness much greater than $\delta$. To consider conducting samples consisting of different shaped structures, the shape function, S(r), is defined that represents the number of nuclear spins at each depth in the sample. Examples of S(r) for the planar surface explored previously and for cylinders and spheres with radii $\delta/2$ are given in FIG. 7, panel (a), assuming a constant spin density over the sample volume in each case. The shape function directly scales the detected signal at each depth and therefore the signal amplitude detected in an experiment using a given k (substituting Equation 15 into Equation 13, assuming $\alpha_{readout}(r_{sel})=\pi/2$ and taking the magnitude), $$|\epsilon(k)| = \frac{1}{k} S(r_{sel}), \quad \text{(Equation 16)}$$

The effect is apparent for the shapes explored in FIG. 7, panel (b), where the signal at r>0 for the sphere and cylinder is attenuated relative to the results for the infinite plane. This effect, in turn, makes a significant impact on the measurable profiles in FIG. 7, panel (c). However, Equation 16 demonstrates how the measurements of $|\epsilon(k)|$ can be converted to recover the underlying shape function, by transforming the measured signal by $k|\epsilon(k)|$ and by transforming k to the selected depth, r=$\delta \ln k$. FIG. 7, panel (d) demonstrates the outcome of this process for the simulated results, showing that S(r) is accurately reconstructed in each case, although there is some deviation at r=0 (k=1), which can be explained by the finite thickness of the excited region in FIG. 7, panel (b); at r=0 the region covers half the area it does at larger depths, and so the sum contribution to the signal intensity is reduced (in fact it should be exactly half the maximum value at r=0).

Figure 8:
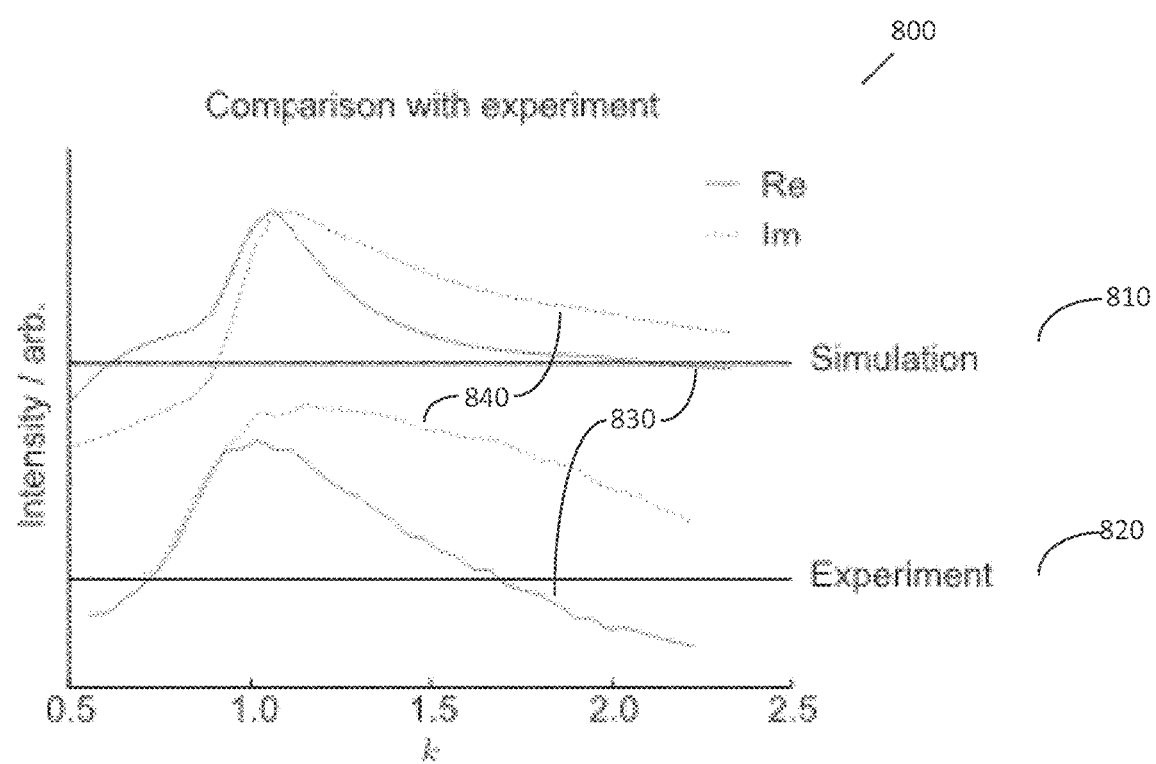
FIG. 8 illustrates experimental results obtained by varying k (by changing the pulse duration, $\tau$, with $\alpha(r=0)=\pi$ corresponding to a 108 µs pulse as calibrated on LiCl(aq)) in the pulse sequence in FIG. 4 with N=16 and $\Delta=800$ µs.

FIG. 8 illustrates the experimental results 820 obtained by varying k (by changing the pulse duration, $\tau$, with $\alpha(r=0)=\pi$ corresponding to a 108 µs pulse as calibrated on LiCl(aq)) in the pulse sequence in FIG. 4 with N=16 and Δ=800 µs. The intensity of the on-resonance position in the frequency domain spectrum is plotted 800. The simulated curve 810 is taken from the sum over all depths of a simulation employing the same parameters as used experimentally, including the pulse widths.

Experimental results 820 using the pulse sequence from FIG. 4 are shown in FIG. 8 with the corresponding simulation results 810. A similar behavior is observed in both simulation and experiment, with a maximum intensity in both the real 830 and imaginary 840 components of the signal at k=1, corresponding to the selection of the slice at the top surface of the $^7$Li metal. According to FIG. 6, panel (a), this slice can be expected to be 2-3 µm thick. The decay of the signal at k>1 is slightly different for the simulated 810 and experimental 820 results, which may be due to differences in the relaxation behavior, although the simulations do include relaxation during the pulses and pulse lengths match those used in the experiment. With higher power pulses, relaxation effects would be less important, and so longer chains of π pulses could be used to enhance the saturation without significantly reducing the signal amplitude. It is assumed that the surface of the metal is smooth and chemically pure on the length scales that is being probed. On the other hand it is likely that some surface roughness contributes to the deviations, particularly because $^7$Li metal is air sensitive (the sample is prepared and sealed in an argon environment).

Even without understanding the effects at k>1, simply by recording the curve in FIG. 8 and selecting the value of k that gives the maximum signal is sufficient to optimize the sequence to select only surface sites. This approach also circumvents any problems assessing the actual field strength at the surface of the metal or using a reference sample.

In one embodiment, the method of probing the method of probing the layers above, at, and below the surface of a conducting region comprises exciting nuclear or electronic spins within the conducting region using a first frequency and receiving a second frequency from the conducting region. The length scales are determined by the conductivity of the conducting region and the first frequency and a depth profile is obtained of the conducting region. The conducting region may be composed of various conductive or semi-conductive matter or states of matter including metallic conductors, semi-conductors, plasmas, electrolyte solutions, superconductors, etc. The method may further comprise tuning the length scale by choosing the operating frequency. The first frequency may be the same or substantially the same as the second frequency or the two frequencies may be different frequencies.

In one implementation of one embodiment where the first and second frequencies are different, the difference may be due to such magnetization transfer effects as cross-polarization, insensitive nuclei enhanced by polarization transfer (INEPT), distortionless enhancement by polarization transfer (DEPT) or other effects and methods known in the art.

In one implementation of one embodiment the receiving of the second frequency step is done or accomplished using the induced magnetic flux in a detection coil by the precessing spin magnetization.

In another embodiment the method of probing the layers above, at, and below the surface of a conducting region may also comprise applying a shape function to the signal received from the detection coil, wherein the shape function directly scales the detected signal at each depth.

In another embodiment, the method of the disclosure may consist of applying a pulse sequence to a conducting region by applying a pulse sequence comprising several rf pulses and delays, wherein the pulse sequence impregnates the conducting region with a certain pattern of z-magnetization and then reading out the pattern of the z-magnetization. The pattern may be the result of the application of repeated pulses which are attenuated and phase-shifted within the conducting region. The pattern may be adjusted within the conducting region by altering delays, pulse flip angles and repeats in the pulse sequence. Alternatively the pattern may be adjusted by the repeat of the pulse sequence with modified rf pulse phases. Alternatively, the pattern may be adjusted through induced changes in conductivity within the layers of the conducting region. Alternatively, the pattern may be adjusted by changes in magnetic resonance relaxation parameters.

In another embodiment, the method of applying a pulse sequence to a conducting region of may take repeated measurements obtained from the reading out the pattern step to quantify the concentration of electron or nuclear spins within the conducting region.

In another embodiment, the method of applying a pulse sequence to a conducting region may use the read out pattern of z-magnetization to measure magnetic resonance parameters. Alternatively, the read out pattern may be used to measure diffusion or flow within the conducting region. The measured diffusion along with a depth profile may be used as a spectrometer or in spectroscopy measurements.

In one embodiment, the method for creating a pulse sequence uses the skin effect in a good conductor which ensures the spatial dependence of the rf field strength and uses flip angle $T_1 > T_2$ because the magnetization from the target depth is stored along the z axis and relaxes via $T_1$ while the unwanted magnetization relaxes via $T_2$. The second process may be faster to saturate the unwanted magnetization while preserving that at the target depth. Different sequences are designed for different $T_1/T_2$ combinations, particularly if they are known for a given sample. Alternately, the embodiment makes a sequence immune to short $T_2$ using a 2-step phase cycle to give some selectivity but not saturate the magnetization at different depths.

In another embodiment, the π pulse chain saturates the magnetization at all but a region around the selected depth thus preparing the magnetization prior to the application of a more complex sequence, allowing the depth dependence of other properties to be explored. Then the combination of chemical shift and depth profile can give information on the composition of the surface and interface resulting in spectroscopy.

In another embodiment, the π pulse chain saturates the magnetization at all but a region around the selected depth thus preparing the magnetization prior to the application of a more complex sequence, allowing the depth dependence of other properties to be explored. Then imaging sequences (short echo time, radial, frequency-encoded sequences in particular) are applied thus revealing the spatial distribution of select depths of the conductor. This may be used to differentiate between regions containing structures of different thickness (i.e. dendrites vs bulk electrode).

In another embodiment, the π pulse chain saturates the magnetization at all but a region around the selected depth thus preparing the magnetization prior to the application of a more complex sequence, allowing the depth dependence of other properties to be explored. Then cross polarization sequences are applied to measure the distance from the surface sites of a conductor to any NMR active nuclei in close proximity. This may then be used to establish that a species is adsorbed or bound to the surface, and transferred magnetization could be used with standard pulse sequences to get properties of the adsorbed species.

In another embodiment, the π pulse chain saturates the magnetization at all but a region around the selected depth thus preparing the magnetization prior to the application of a more complex sequence, allowing the depth dependence of other properties to be explored. Then, $T_2$ measurements may give information on the local dynamics and magnetic interactions In another embodiment, the π pulse chain saturates the magnetization at all but a region around the selected depth thus preparing the magnetization prior to the application of a more complex sequence, allowing the depth dependence of other properties to be explored. Then, $T_{1\rho}$ measurements may probe dynamics on kH timescales very relevant to chemical reactions and other processes occurring on the surface.

In another embodiment, the systems and methods of the disclosure may have relevance to any NMR-active nucleus inside a conductor (not restricted to metals), lithium and sodium battery systems, and/or superconductors.

In another embodiment, the transmission and reception can occur at the same or at different frequencies. When different frequencies are use, one may transmit at a given frequency and create a population distribution for one type of nuclear spin, and upon a magnetization transfer to another type of nucleus, one can detect the signal at a different frequency. Examples of magnetization transfer may include cross-polarization, insensitive nuclei enhanced by polarization transfer (INEPT), distortionless enhancement by polarization transfer (DEPT) or other methods.

FIGS. 10A-C illustrate one embodiment of an MRI setup: FIG. 10A illustrates the rf coil or resonator covers the full sample volume, and surface layers of the conducting region are probed by the pulse sequence. In addition morphological details are probed above the surface via the susceptibility differences between the materials. FIG. 10B illustrates the coil or resonator can be situated above the surface and scan the surface of the material in a setup similar to atomic force microscopy or magnetic resonance force microscopy. The local surface layers are probed by the pulse sequences described. FIG. 10C illustrates morphological details are obtained by (a) probing the surface penetration of the electromagnetic fields and using the pulse sequences (b) probing morphology is also performed by visualizing the changes above the surface.

In another embodiment, an apparatus is described containing a device for irradiating a sample with a first frequency. In one implementation, in the case of magnetic resonance, this device would be a radio-frequency or microwave coil or resonator/cavity, plus associated amplifiers and pulse controllers. A second device is described for receiving a signal or signals from the sample with a second frequency. The frequencies could be the same, substantially the same, or different. The second device could be a separate detection device comprising a microwave coil or resonator/cavity or resonator tuned to a different frequency. The second device may be hooked up to a preamplifier and the signal digitized for processing.

In another embodiment, the apparatus used is a conventional NMR spectrometer. Special coils and/or resonators may enhance the performance. In another embodiment, the apparatus may be a conventional MRI imager. Special coils and/or resonators may enhance the performance.

In another embodiment, the methods include applying a pulse sequence to a conducting region by indirectly detecting microscopic structures of a magnetic susceptibility different from the surrounding material using a gradient echo Magnetic Resonance Imaging experiment observing the surrounding medium, wherein the susceptibility differences are observed through the induced frequency changes. FIGS. 11A-F illustrates a demonstration of frequency changes around a conducting microstructure region, calculated via finite element methods. The histogram shows the frequency distributions. For example, one such high magnetic susceptibility material is metallic dendrites whose dimensions are typically of the order of 10s of micrometers or less. Susceptibility differences on the order of well below $10^{-6}$ could be observed in this way. Growth of metallic dendrites is a frequent failure mechanism in Li-ion batteries, and some of its alternatives, hence the ability to measure these effects is of importance in the battery field.

In another embodiment, the methods are applied to a battery, such as a Li-ion battery. In one particular embodiment, a casing 1200 is designed for imaging batteries, fuel cells, or other electrochemical cells, wherein at least one side of the casing is made of non-conducting material to allow radio-frequency fields to enter for analysis. A schematic of one such casing is depicted in FIGS. 13A-C as a non-limiting example. The side casing is made of non-conducting material. The battery comprises: a non-conducting cell housing 1201, a conducting end cap 1202, a conducing spring 1203, a conducting current collector 1204, an anode 1205, a separator 1206, and a cathode 1207. The casing 1200 is made to mimic common battery form factors such that real battery materials and geometries can be tested. In the case of Li-ion battery coin cells, this device, assembled with the casing 1200 can be used for noninvasive battery testing, analysis, and imaging, including the surface microscopy techniques described above, for analyzing electrode surfaces, and imaging the surrounding space via indirect effects on the electrolyte. In addition, these techniques could be used to assess the transport properties and quality of electrolytes and separator materials.

In another embodiment, the method relates to indirectly detecting the volume and porosity of conducting structures by measuring the space around it with NMR spectroscopy or MRI. The volume and morphology of the structures is inferred by induced magnetic susceptibility shifts, which can be amplified by destructive interference by increasing the waiting time in the pulse sequence so that inhomogeneity shifts can evolve for longer times. Susceptibility imaging can be supplemented by machine learning algorithms, wherein the measured images are compared with rapidly generated models of different morphologies, and machine learning algorithms are employed to train an algorithm to recognize the different morphological features in the structures. The susceptibility weighting can be done specifically in the surroundings of a conducting region or within this region, such as a battery as discussed below.

Examples of calculations and experiments for susceptibility weighted imaging methods are shown in FIGS. 11A-F and FIGS. 12A-C. FIGS. 11A-F illustrates a demonstration of frequency changes around a conducting microstructure region, calculated via finite element methods. The histogram shows the frequency distributions. FIGS. 12A-C illustrate In situ $^1$H 3D FLASH imaging results from an electrochemical cell charged at 160 µA. FIG. 12A shows 2D slices from four time points, FIG. 12B shows segmented images of the results from FIG. 12A where $I_{threshold}=0.2I_{max}$, FIG. 12C shows 3D segmented images of the same time points with an additional Gaussian filter applied to smoothen the visualization.

In another embodiment, the method comprises tuning excitation pulse/repetition time to maximize the contrast afforded by inhomogeneities in the excitation/detection rf field amplitude and phase. The tuning of the excitation pulse/repetition time may be based on estimates from rf field calculations on representative systems or based on the general trends found from such calculations.

Figures 14A, 14B:
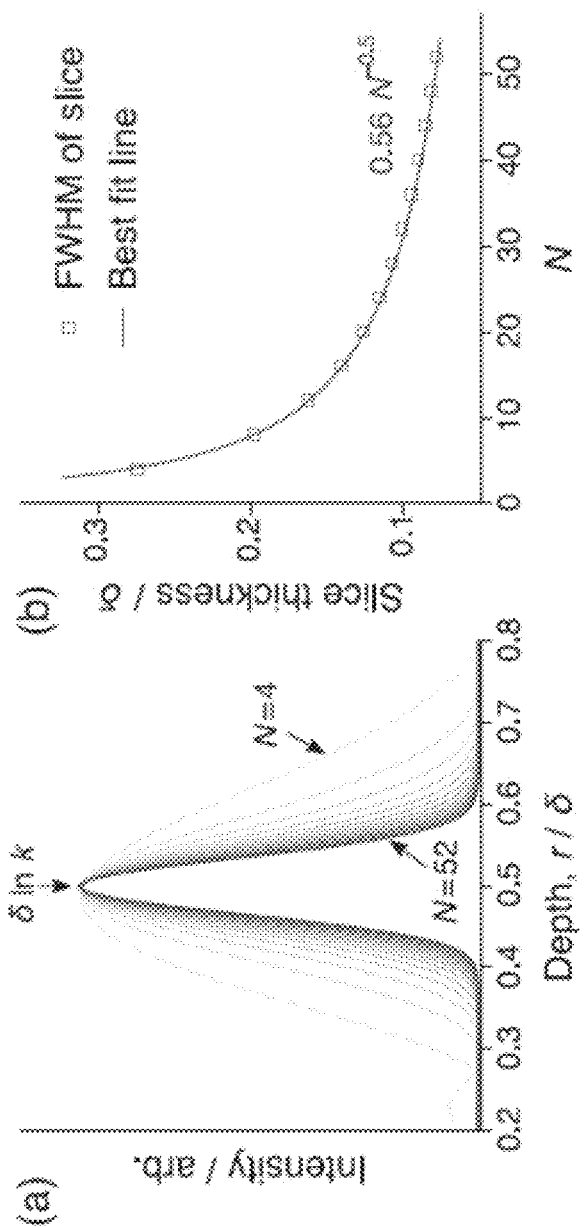
FIG. 14A shows simulated slice profiles using SMC with N=4 to 52 (in steps of 4), using a single value of k=1.65. The maximum value of the curves is normalized to allow for a direct comparison of the slice width.
FIG. 14B shows calculated full width at half maximum (FWHM) of the lineshapes in FIG. 14A plotted against N. The Bloch simulations performed with $\Delta=800$ µs, $T_1=170$ ms, $T_2=600$ µs and $\tau(\pi$-pulse$)=10$ µs.

Experimentally, the application of the SMC sequence using a given value of k will result in an NMR signal originating form a discrete spatial region in a conductor; a slice. The simulated behavior of this slice profile for k=1.65 with varying N is shown in FIG. 14A, where it is demonstrated that the choice of N controls the thickness of the slice profile. The larger N, the narrower the selected slice. As shown in FIG. 14B, the relationship between the full width at half maximum (FWHM) of the slice profile and the value of N is highly predictable, fitting very well to a $w_0/\sqrt{N}$ dependence. Here, $w_0$ is a fitted parameter that is associated with the intrinsic dispersion of spins selected by each pulse and their $T_2$ constants. The lineshapes in FIG. 14a are very close to Gaussian, although there is a notable distortion in the profile when N=4 arising from the $e^{-\beta r}$ dependence of the detection field that skews the lineshape towards low r values.

Figures 15A, 15B:
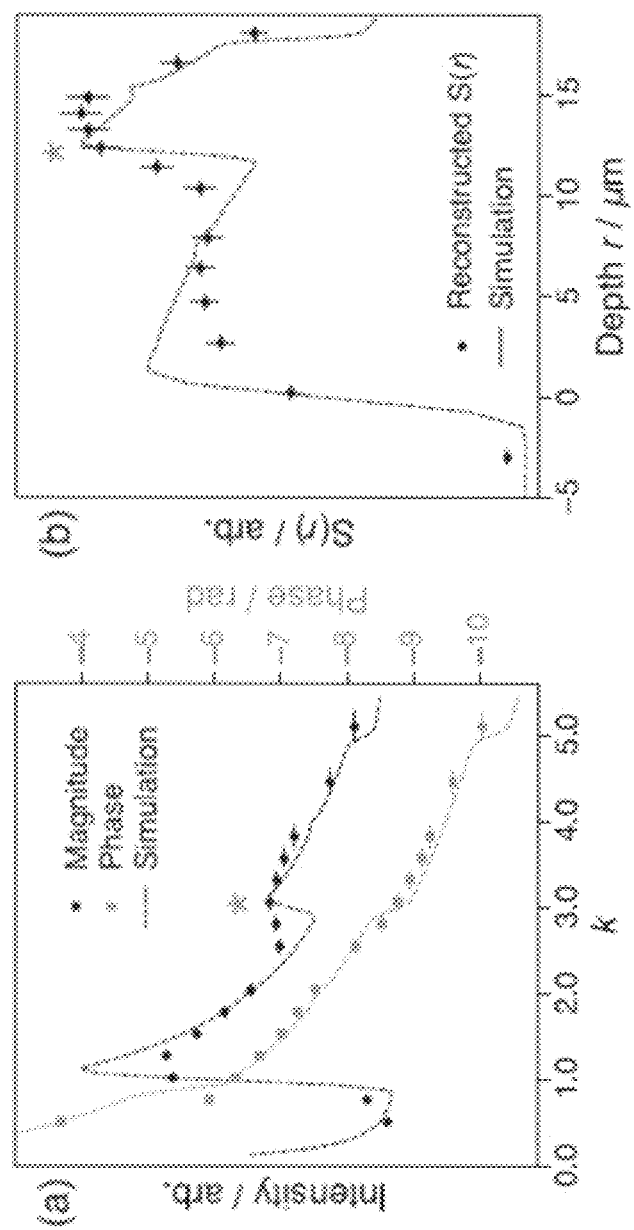
FIGS. 15A-B show $^7Li$ experimental results obtained on a lithium metal strip.

Experimental results using SMC on a lithium metal strip are shown in FIG. 15A with the corresponding simulation results. The experimental results show a good fit to the simulated curve. According to FIG. 14, the slices can be expected to be about 2-3 μm thick.

It is possible to convert the k axis to a depth using Equation 15. The y axis, Sig(k) can also be converted into a profile of the spin density as a function of depth S(r) by accounting for the exponential dependence of the detection field, $$\mathrm{Sig}(k) = S(r) e^{-\beta r_{sel}} \quad \text{(Equation 17)}$$

$$S(r) = k \ln[\mathrm{Sig}(k)] \quad \text{(Equation 18)}$$

Using Equation 15 to substitute the experimental parameter k for $r_{sel}$. By transforming the axes in this manner, a depth profile through the surface of the object is obtained. For the lithium metal strip, this profile (FIG. 15B) is flat in the region $0 < r < \delta$ as expected for a uniform metal. For $\delta < r$ the profile represents the sum of the n=1 and the n=3 bands. This contribution could be removed by the use of supercycles or specific readout pulses as mentioned above. Nevertheless, the profile in FIG. 15B represents a 1D slice of the metal profile with micron-scale resolution in the region $0 < r < \delta$.

A limitation of SMC is that the simulations and the conversion to the depth-sensitive spin distribution, S(r) require knowledge of $B_1$ and $B_{10}$. Although these could be calibrated, when particle sizes and surface curvature are on the order of δ, further complications arise and $B_1$ is not known analytically. The orientation of the particle surfaces with respect to the incoming rf field direction is also important. $B_{10}$ will therefore be inhomogeneously distributed in powdered samples.

Despite the difficulties in evaluating the exact rf field in powdered samples, SMC can be useful in determining the approximate particle size and in distinguishing between rf field distributions (FIG. 16). Moreover, by choosing appropriate values of k, the SMC pulse chain can be used to selectively excite the MR signal from some particles while saturating others. For example, for the two samples shown in FIG. 16, an SMC excitation at k=1.8 selectively excites the larger particle distribution and saturates magnetization elsewhere, thus allowing the relative populations and information about the particle size distribution to be ascertained. In particular, if the particle size is on the order of the skin-depth, these particles can be easily saturated by using a large k. By contrast, using a small k will favor the smaller particles. In the results shown in FIG. 16, the peak close to k=1 indicates particle sizes on the order of the skin-depth, while there is a broad distribution for the other sample, with significant signal up until k=3. Clearly, if the particles are approximately of the same size as the skin depth or smaller, particle morphological features could also be determined with this method, by taking advantage of characteristic rf field profiles within the material, which leads to partial signal cancellations.

While there exist many techniques for particle-size measurements, the NMR-based approach has the advantage of being compatible with analyzing opaque objects. Clearly, a limitation of the technique is that high spatial localization is only given along one dimension. When analyzing surfaces with uniform conductivity values, the SMC technique would, however, allow, for example, the measurement of the propagation of different metals into a bulk conducting region as a function of time or a particular driving force. One specific example would be the study of $^6$Li and $^7$Li isotope ratios at different depths of a lithium metal electrode, when supplied with an excess of one isotope at the initial point. The main constraint in such an application (aside from sensitivity constraints) is simply given by the strength of the rf field: The rf power needs to be significantly stronger than $1/T_2$, while $T_1$ needs to be significantly longer than the duration of the pulse train.

The spatial dependence of the rf field within a conductor makes it useful for the selection of slices within the material and to produce depth-selective measurements with NMR and MRI. Using a pulse sequence based on repeated inversion and saturation steps, slices with sub-micron thickness can be selected at a well-defined depth from the surface of a conductor. The slice position and width can be controlled by pulse sequence parameters. In systems where the rf field profile of the conductor is not known analytically or when inhomogeneities in the sample shape and surface orientation result in a distribution of rf field intensities at the conductor surface, the method can be used to discriminate between different particle distributions, to selectively excite a signal from some particles and not from others, or to provide a fast measure of surface area and morphology.

The pulse sequence can also be used to prepare the magnetization prior to the application of a more advanced readout sequence, allowing the depth dependence of other properties to be explored. This could include, for example, imaging sequences, cross polarization sequences to transfer the magnetization to secondary nuclei (also allowing distance measurements) and $T_2$ or $T_{1\rho}$ relaxation measurements. Applying SMC in these ways could provide new routes to understanding the properties of conducting surfaces at sub-micron length scales. These capabilities may make the technique suitable for applications in studies of lithium or sodium battery systems, superconductors or electronics components. Further applications could include metallurgy, when location-specific composition is probed, or where probes of metal diffusion would be desired.

As discussed above, the spatial resolution of traditional Magnetic Resonance Imaging (MRI) techniques is typically dictated by the strength of the applied magnetic field gradients, resulting in hard resolution limits of the order of 20-50 μm in favorable circumstances. The embodiments of the present application describe a technique which is suitable for the interrogation of regions at specified distances below the surface of conducting objects with a resolution well below these limiting values. This approach does not rely on magnetic field gradients, but rather on the spatial variation of the radiofrequency field within a conductor. Samples of aluminium and lithium metal with different sizes and morphologies are examined with this technique using $^{27}$Al and $^{7}$Li NMR. In this implementation, the slice selectivity depends on the conductivity of the material, as well as on the frequency of operation, although in the most general case, the technique could also be used to provide spatial selectivity with arbitrary B1 field distributions in non-conductors.

In general, the system and method described in this application relate to indirectly detecting the conductivity distribution and the distribution of magnetic susceptibility of conducting structures by measuring the space around it with NMR spectroscopy or MRI. In the embodiments described in this application, the conducting structure is a battery. However, the present application is not limited in this regard. The conducting structure may be, for example, a capacitor, a supercapacitor, a fuel cell, a catalyst material, etc. A method of diagnosing a battery includes providing the battery in a magnetic field, immersing the battery in a detection medium, or placing a detection medium in the vicinity of the battery, exciting nuclear or electronic spins within the detection medium using a broad-band excitation pulse, receiving an NMR or ESR spectrum from the detection medium, obtaining a frequency distribution of the detection medium, and indirectly measuring internal characteristics of the battery by characterizing frequency changes in the frequency distribution. Batteries are analyzed on the basis of changes in magnetic susceptibilities, a measure of the degree of magnetization of a material when a magnetic field is applied, and internal electric current distributions, which may change over the course of a charging/discharging cycle, and a result of battery degradation and failure.

Referring to FIGS. 17A-17D, a system 100 for magnetic resonance mapping of physical and chemical changes in a battery 200 includes a holder 10 configured to receive the battery 200, a radiofrequency coil 20, and an NMR/MRI magnet 30. In use of the system 100, the battery 200 is disposed within the radiofrequency coil 20. The radiofrequency coil 20 is then disposed within an isocenter of the NMR/MRI magnet 30. In some examples (e.g., FIGS. 17A-17D, the holder 10, the radiofrequency coil 20, and the NMR/MRI magnet 30 are concentric. In other examples (e.g., FIG. 21C), the holder 10, the radiofrequency coil 20, and the NMR/MRI magnet 30 are not concentric. The radiofrequency coil 20 can be repeatedly removed and inserted within the NMR/MRI magnet 30. The holder 10 can be repeatedly removed and inserted within the radiofrequency coil 20. The system 100 may also include a spectrometer containing a gradient assembly and/or an imaging probe. Either direct or alternating electrical current distributions can be measured. For the measurement of alternating current distributions, a pulse sequence can be used with pulse sequence elements, such as a radio-frequency pulse, which is modulated with the same frequency as the alternating electrical current. In this way, by analyzing phase-map images, one can obtain not only the magnitude of the current, but also the phase of the current, from which one can further obtain the localized distribution of impedances across the sample (i.e. the battery or the object of interest). The method can then be used by scan in a localized way the response of different parts of the object using different alternating electrical current frequencies. We wish to refer to this particular method as MR-based localized electrical impedance spectroscopy (MRLEIS).

Figures 17A, 17B, 17C, 17D:
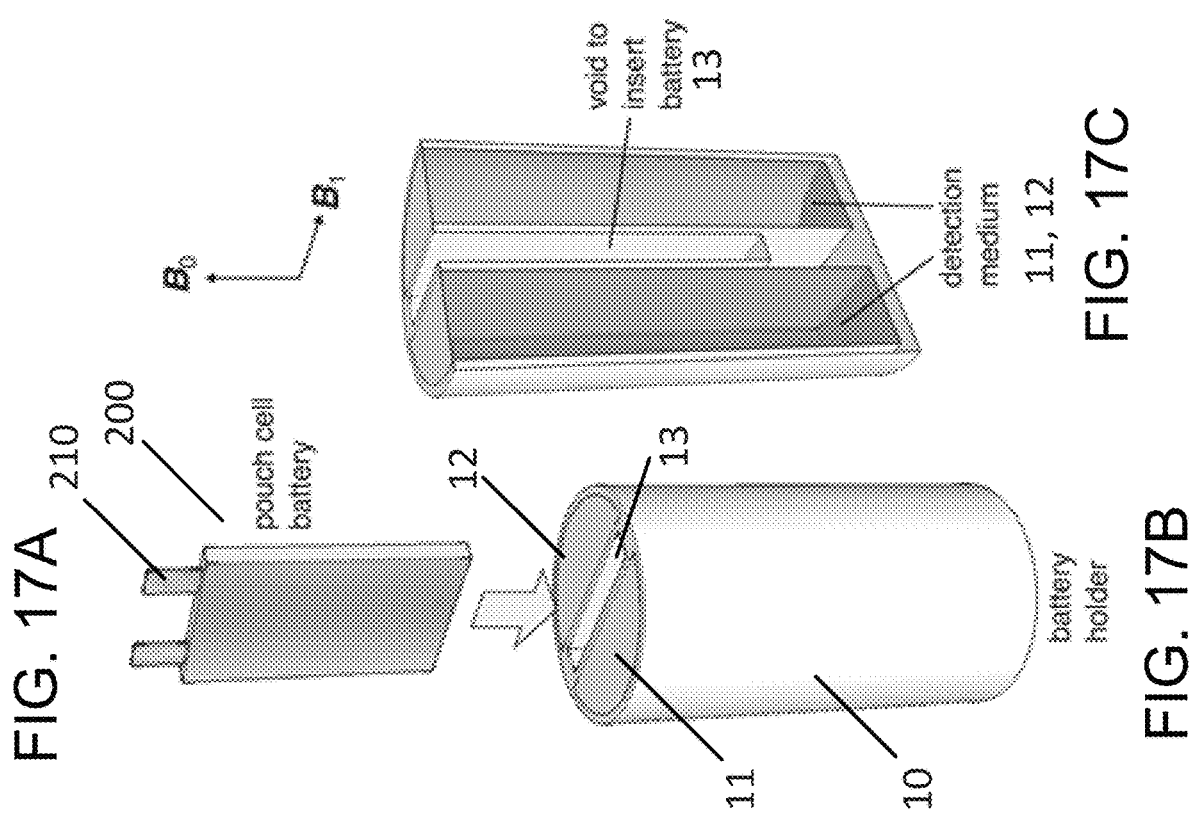
FIGS. 17A-17D illustrate a system for magnetic resonance mapping of physical and chemical changes in a battery, measured with magnetic resonance imaging.

The holder 10 may be made of any non-magnetic material. For example, the holder 10 may be made of plastic such as poly lactic acid (PLA) plastic or acrylonitrile butadiene styrene (ABS) plastic. The holder 10 may be manufactured in any manner, for example, by 3D printing. In the example of FIG. 17B, the holder 10 is cylindrical and partitioned into three portions: a first detection medium chamber 11, a second detection medium chamber 12, and a battery chamber 13 that separates the first detection medium chamber 11 and the second detection medium chamber 12. In other examples, the holder 10 is not cylindrical. For example, the holder 10 may have a square, obround, ovular, rectangular or otherwise oblong cross section.

The first detection medium chamber 11 and the second detection medium chamber 12 are configured to be filled with a same volume and same kind of detection medium. Each of the first detection medium chamber 11 and the second detection medium chamber 12 extends from a top of the holder 10 to a bottom of the holder 10. The detection medium may be, for example, water or water doped with a paramagnetic species (e.g., $CuSO_4$, Gd-DTPA), to shorten the T1 relaxation times for faster measurements. Other examples of a detection medium that may be used include oil or tetramethyl silane. Any detection medium may be used provided the detection medium is MR active and compatible with the material from which the holder 10 is made. The minimal requirement for the detection medium is to contain a sufficient concentration of nuclear or electronic spins leading to a strong enough magnetic resonance signal. For the detection medium, liquids are preferred because they produce narrow lines with high signal-to-noise ratios, but in some examples, it may be possible to use gas as a detection medium. The ideal detection medium would also produce only a single resonance in the frequency spectrum with little internal interactions. An example is liquid water with $^1$H nuclear spins, which produces a very strong signal. Solids could also be used as the detection medium, but a high symmetry solid would be desired in order to minimize internal interactions, such as chemical shift anisotropy. Solids could be relevant for high-temperature applications. A low electric permittivity can increase the range of the detectable magnetic fields. Such a sample could be constructed from an oil sample, for example. It is advantageous to select a detection medium that provides a maximum MR signal (this is achieved, for example, by using a high-density liquid such as water as the detection medium).

In examples in which the detection medium is water doped with a paramagnetic species, the paramagnetic species may increase spin-lattice relaxation, and thus, the experiments could be sped up. One can typically choose a concentration regime where $T_2^* < T_2$ such that the signal amplitude is not significantly compromised due to excessive linebroadening introduced by the paramagnetic species. The first detection medium chamber 11 and the second detection medium chamber 12 are configured to be sealed during use of the system 100.

The battery chamber 13 is configured to receive the battery 200 to be evaluated by the system 100. In the example of FIG. 17B, the battery chamber 13 is a rectangular slot in a central portion of the holder 10. The battery chamber 13 extends from the top of the holder 10 to a position above the bottom of the holder 10. In other words, the battery chamber 13 does not extend to the bottom of the holder 10. The battery chamber 13 may be configured to receive a capacitor, a supercapacitor, a fuel cell, or a catalyst material.

In the example of FIG. 17A, the battery 200 is a pouch cell battery having electrodes 210 extending from a top surface thereof. When the battery 200 is received by the battery chamber 13, the battery 200 is oriented such that the electrodes 210 are proximal to the top surface of the holder 10 and the bottom surface of the battery 200 is distal to the top surface of the holder 10. At least a portion of the battery 200 rests on a bottom surface of the battery chamber 13. A first space exists between a top of the battery 200 and the top of the holder 10. A second space exists between a bottom of the battery 200 and the bottom of the holder 10. By having the length of the battery 200 shorter than the length of the first detection medium chamber 11 and the second detection medium chamber 12 containing the detection medium, a more uniform magnetic field can be observed across the detection medium. This is not essential, however, as in other examples, the battery chamber 13 may extend an entire length of the holder 10 and the battery 200 may have a length greater than or equal to the length of the first detection medium chamber 11 and the second detection medium chamber 12 containing the detection medium. In some examples, it may be preferable to have the detection medium extend over a length of about ⅓ of the battery length at both the top and the bottom. The battery holder 10 is configured to fill the available volume of the radiofrequency coil 20 (e.g., a cylindrical space having dimensions, for example, of a 40 mm diameter and a 60 cm height 60 cm), while keeping the battery 200 centered. This setup allows for the largest area around the battery 200 to be mapped and compared to calculations for ascertaining the magnetic susceptibility of the battery 200, and therefore, in most cases, this setup will be optimal. If a smaller battery is evaluated, the size of the first detection medium chamber 11 and the second detection medium chamber 12 containing the detection medium would be the same, but the size of the battery chamber 13 would be reduced. The top surface of the battery chamber 13 is configured to remain unsealed during use of the system 100, to allow access to the electrodes 210 during evaluation of the battery 200.

The size of the holder 10 and the shape and size of the battery chamber 13 may be modified/customized to receive different shapes and sizes of batteries.

A method for magnetic resonance mapping of physical and chemical changes in a battery using the system 100 will now be described. The method includes using magnetic resonance to indirectly measure internal characteristics of a battery. Instead of detecting physical and chemical changes of the battery by directly imaging the battery, the method of the present application involves detecting changes in the detection medium that surrounds the battery and using the data to reconstruct information about the chemical and physical changes occurring inside of the battery. The detectable changes may originate from changes in magnetic susceptibilities, leading to alterations of induced magnetic moments, from changes in the permanent magnetism inside the cell, or from changes in the current distribution inside the battery.

The changes in the oxidation states of the electrochemically active ions and components of the electrode materials are intrinsic processes occurring in electrochemical devices. These changes can impact the local structure and other properties, such as their local magnetic properties. For example, the lithiation state in $Li_xCoO_2$, a common cathode material, is closely tied to the electronic structure of the Cobalt ion in the rigid $CoO_2$ layers. See Hertz, J. T.; Huang, Q.; McQueen, T.; Klimczuk, T.; Bos, J. W. G.; Viciu, L.; Cava, R. J. *Phys. Rev. B*, 77 (7), 75119 (2008), the entire contents of which is hereby incorporated by reference for all purposes including for the disclosures related to examples of how the magnetic susceptibility of electrode materials change upon lithiation. The $Co^{4+}$ ions change from high spin (5 unpaired electrons) when $x≥0.97$ to low spin (1 unpaired electron) for $0.50≤x≤0.78$, and there is an accompanying increase in the magnetic susceptibility of the material by an order of magnitude. Examples of these processes include, for example, effects in carbon anodes/$LiFePO_4$ (see Kadyk, T.; Eikerling, M. *Phys Chem Chem Phys*, 17 (30), 19834-19843 (2015), the entire contents of which is hereby incorporated by reference for all purposes including for the disclosures related to examples of how the magnetic susceptibility of electrode materials change upon lithiation), and NiMnCo cathode materials (see Chernova, N. A.; Ma, M.; Xiao, J.; Whittingham, M. S.; Breger, J.; Grey, C. P. *Chem. Mater.* 19 (19), 4682-4693 (2007), the entire contents of which is hereby incorporated by reference for all purposes including for the disclosures related to examples of how the magnetic susceptibility of electrode materials change upon lithiation).

First, the first detection medium chamber 11 and the second detection medium chamber 12 of the holder 10 are filled with a desired detection medium and sealed. The battery 200 is then inserted into the battery chamber 13 of the holder 10. Next, the holder 10 is disposed within the radiofrequency coil 20. The radiofrequency coil 20 is then disposed within the isocenter of the NMR/MRI magnet 30. The battery 200 may be evaluated ex situ (i.e., charge/discharge stopped data acquisition) and/or in situ (i.e., a current is applied such that charge/discharge occur during data acquisition). A static magnetic field $B_0$ is applied. The nuclear or electronic spins within the detection medium are excited using a broad-band excitation pulse (e.g., a RF frequency for nuclear spins). A phase map is acquired and processed as described below in order to obtain a frequency distribution within the detection medium. The measurements are performed either during charging or discharging of the battery, either while current is flowing, or while current is stopped.

In one example, the internal characteristics of the battery are modeled on the basis of magnetic susceptibility differences and changes within the battery. This is accomplished by assigning one or several regions within the battery a given magnetic susceptibility and calculating the effect on the surrounding medium. The susceptibilities of the different regions form parameters that can be fit by minimizing the differences between the calculated and the measured frequency distributions in the surrounding detection medium or the detection volume.

From the observed frequency changes in the frequency distribution, it is possible to infer the overall changes in magnetic susceptibility distributions within the battery. This is important in the context of studying the health and general state of a battery and could be relevant for studying battery failure mechanisms and quality control. In particular, data from a standard MRI phase map is processed to measure the symmetry of the collected image. The symmetry of the collected image is then compared to a predetermined standard acceptable symmetry. The symmetry of the materials inside the battery is indicative of failure mechanisms, quality control during production (e.g., indicative of whether the manufactured batteries fall within an acceptable range of symmetry) and information about the efficiency of the cell during cycling. With regards to cell cycling, the comparison will indicate whether some regions of the battery are cycling more efficiently than others due to local hotspots in the electric current. This information can be obtained based solely on the frequency distribution of the detection medium (i.e., without opening the battery or measuring the battery directly).

Figure 22:
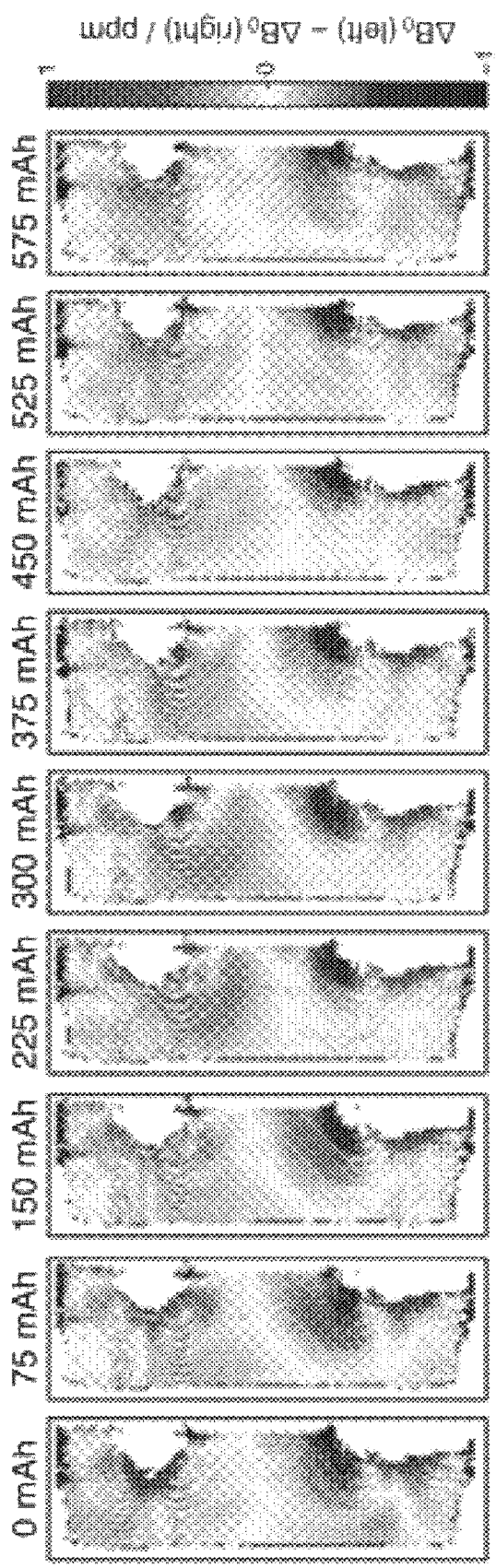
FIG. 22 illustrates a pixel-wise difference between the left and right hand sides of the magnetic field maps from FIG. 18, which were obtained ex situ during cell discharge.

A pixel comparison of the difference between the left and right hand sides of the magnetic field map may also be used to infer the overall changes in magnetic susceptibility distributions within the battery. FIG. 22 illustrates the results of taking a pixel-wise difference between the left and right hand sides of the magnetic field maps from FIG. 18, which were obtained ex situ during cell discharge. The discharge level is indicated in reference to the discharge capacity. The background field is subtracted from each map prior to taking the difference.

In another example, the internal characteristics of the battery modeled on the basis of current distributions within the battery. This is accomplished by assigning one or several regions within the battery volume given current distributions. From the currents, the generated magnetic fields are calculated and their effects on the surrounding medium are determined. The current amplitudes assigned to different regions in the battery form parameters that can be fit by minimizing the differences between the calculated and the measured frequency distributions in the surrounding detection medium or the detection volume.

In the examples in which the internal characteristics of the battery are modeled on the basis of magnetic susceptibility differences and changes within the battery, or current distributions within the battery, the state of charge (SOC) of the battery is determined by converting the determined frequency distributions into the state of charge. In conventional diagnosis methods, intact batteries are diagnosed by measuring their voltage and resistance/impedance. These values can be related to state of charge (SOC) by making calibration curves for the battery in a similar way. However, as the battery ages, the calibration changes and so mathematical models need to be included that account for aging. However, this requires some knowledge of the battery history, such as cycle life/battery health. By measuring the detection medium, as opposed to the voltage and resistance/impedance of the battery itself, it is possible to provide an independent measure of the SOC. If desired, the independent measure of the SOC may be combined with the voltage/resistance measurements to double-check the SOC and battery health.

Several experiments were performed, as described below.

Experimental Setup

In the experiments, the holder was 3D printed using PLA plastic. The detection medium selected was water. The battery was a non-magnetic PGEB-NM053040 lithium polymer pouch cell having a rated capacity of 600 mAh and a measurement of 5 mm×30 mm×40 mm. Prior to the experiments, the battery (i.e., the pouch cell) was fully charged by applying 120 mA (0.2 C) current until the cutoff voltage of 4.2 V was reached.

MRI Experiments

The MRI experiments were performed on a Bruker Ultrashield 9.4 T Avance I spectrometer containing a Bruker Mini 0.75 gradient assembly and operating at 400.1 MHz for 1H. A Bruker MiniWB57 imaging probe was used to collect the data, with a Bruker WB57 40 mm inside diameter (i.d.) coil insert for $^1$H experiments. 2D and 3D gradient echo experiments were performed using the FLASH sequence implemented in Paravision 5.1.

For the 2D experiments, a 1 mm slice was acquired with a 51.2×51.2 mm square field of view (FOV) with 128 points in both the read and phase dimensions, to give a nominal resolution of 0.4×0.4 mm. The slice was taken perpendicular to the major face of the battery (hereinafter the "sagittal plane"), which is illustrated in FIG. 17D. Spatial encoding using the readout gradient was performed in the vertical (z) direction which gave fewer artifacts from the detection medium outside the FOV. For the ex situ experiments, a nominal flip angle ($\alpha$) of 15° was used with a repetition time (TR) of 100 ms. The ex situ experiment took 2 min 33 s, with 12 averaging scans (NS) acquired. For in situ experiments, a nominal flip angle ($\alpha$) of 10° was used with a repetition time (TR) of 40 ms. The in situ experiment took 20 s, with 4 averaging scans (NS) acquired. Reasonable experiment times were chosen and then the flip angles can be taken as slightly less than the Ernst angle ($\alpha \leq \alpha_E = \cos^{-1}(e^{-TR/T1})$ with $T_1 = 2.5$ s for water). For the in situ and 3D experiments it was important to minimize the experiment time, and TR and $\alpha$ were reduced accordingly. Additional parameter tests were performed to maximize the signal to noise ratio (SNR) for a given experiment time.

The 3D experiments used an isotropic 51.2 mm FOV with 128 points in each dimension to give a nominal, isotropic resolution of 0.4 mm. For the 3D experiments, a nominal flip angle ($\alpha$) of 5° was used with a repetition time (TR) of 15 ms. The 3D experiment took 4 min 5 s, with 1 averaging scan (NS) acquired. The 3D experiments measure the same properties (a phase map) as the 2D experiments, but in all three spatial dimensions. Only two spatial dimensions are mapped in the 2D experiments, with slice selection used during the rf excitation to localize the maps to a single slice in the third dimension. 3D measurements could provide additional accuracy.

The experiments were repeated at multiple echo times (TEs) from a minimum of 2.45 ms, and the image series used to reconstruct the local field map surrounding the battery, as detailed below.

Image Processing

The purpose of the gradient echo MRI experiments is to obtain the true phase maps, $\theta(r)$, of the detection medium. However, the detection of NMR or MRI is limited to the range $(-\pi, \pi]$, and so any regions of the measured phase maps, $\theta_{wr}(r)$, that lie outside of this range will be wrapped, $\theta_{wr}(r) = \theta(r) - 2\pi n(r)$. To recover the true phase maps, the integer wrapping parameters, $n(r)$, must be obtained. In general, the accumulated phase is proportional to the TE used in the experiment, $\theta(r, TE) = \theta_{rec}(r) + \omega(r) \cdot TE$, where $\omega(r)$ is the angular frequency offset relative to the carrier frequency of the rf pulse used and $\theta_{rec}(r)$ is an additional, static phase offset caused by the receiver. The time-dependent effects of nutation can be isolated by comparing the phase difference between two consecutive echoes, $\delta TE_{i+1,i} = TE_{i+1} - TE_i$, so that $\delta\theta_{i+1,i}(r) = \omega(r) \cdot \delta TE_{i+1,i}$ (where the i subscript indicates the echo number). The consecutive echoes can be obtained from a multi-echo acquisition after a single excitation, or from separate experiments. The former approach allows for a more rapid overall acquisition but results in longer $\delta TE_{i+1,i}$ times due to the need for additional gradients to be applied. The latter approach, used here, has the advantage of allowing arbitrarily small values for $\delta TE_{i+}$ $_{1,i}$, limited only by the effective clock speed of the spectrometer, which is typically of the order of 1 μs or less. Minimizing $\delta TE_{21}$ reduces the occurrence of phase wrapping between the consecutive scans.

Following roughly the methodology of the UMPIRE algorithm (Robinson, S.; Schödl, H.; Trattnig, S. *Magn. Reson. Med. Off. J. Soc. Magn. Reson. Med. Soc. Magn. Reson. Med.*, 72 (1), 80-92 (2014), the entire contents of which is hereby incorporated by reference), experiments were obtained at four different TEs, $TE_1$=2.45 ms, $TE_2$=2.50 ms, $TE_3$=2.75 ms and $TE_4$=2.80 ms. By converting each image, $S_i$ to a phase map, $$\theta_{wr}^i(r) = \tan^{-1}[Im(S_i(r))/Re(S_i(r))], \quad \text{(Equation 19)}$$

the difference maps $\delta\theta_{21}(r)$, $\delta\theta_{32}(r)$ and $\delta\theta_{43}(r)$ can be obtained and used to calculate three estimates of $\omega(r)$. The median value of $\omega(r)$ is then used to find the integer coefficients $n_{i+1,i}(r)$ that unwrap each of the phase difference images, $$n_{i+1,i}(r) = \left\lfloor \frac{\delta\theta_{i+1,i}(r) - \delta TE_{i+1,i} \cdot \omega(r)}{2\pi} \right\rfloor, \quad \text{(Equation 20)}$$

where the brackets denote the floor function. Each phase difference map is unwrapped accordingly, $$\delta\theta'_{i+1,i}(r) = \delta\theta_{i+1,i}(r) - 2\pi n_{i+1,i}(r). \quad \text{(Equation 21)}$$

From the set of unwrapped phase difference maps a second, more accurate estimate of $\omega(r)$ can be obtained, again by taking the median of the values from the three phase difference images. Eqs 20 and 21 can then be used to unwrap the original phase maps and obtain the true phase maps, $\theta(r)$, at each of the echo times.

One aspect of interest is their field map, which is expressed in units of ppm relative to the Larmor frequency, $\nu_0$, of the $^1$H nuclear spin (400.13 MHz at the 9.4 T field used in the experiments), $\Delta B_0(r) = (\omega(r)/2\pi) \cdot (10^6/\nu_0)$. While this quantity could be calculated directly from the most accurate estimate of $\omega(r)$ obtained from the difference maps, pixel-wise least square fits of $\theta(r)$ as a function of TE can provide more accurate values incorporating all of the data. Moreover, the total least squares error on each fit can be used to discriminate between pixels where the unwrapping procedure has or has not worked. In the pixels where the unwrapping procedure failed, typically 10-20 pixels per image, a nearest-neighbor smoothing algorithm was used to assign $\Delta B_0(r)$.

The results from the gradient echo experiments were converted into an unwrapped phase map, and finally to a magnetic field map via the UMPIRE algorithm. The magnetic susceptibility of the battery is calculated from the field map by comparing the experimentally obtained $\Delta B_0(r)$ map with calculation. In particular, the field map surrounding a model battery geometry matching the powerstream cell was calculated using the FFT method, with the same FOV (zero filled) as the experimental image. The FFT method is described, for example, in Salomir, R.; de Senneville, B. D.; Moonen, C. T. *Concepts Magn. Reson.*, 19B (1), 26-34 (2003), and Ilott, A. J.; Chandrashekar, S.; Klöckner, A.; Chang, H. J.; Trease, N. M.; Grey, C. P.; Greengard, L.; Jerschow, A. *J. Magn. Reson.* 245, 143-149 (2014), the entire contents of which are hereby incorporated by reference. The susceptibility value for the battery was fitted using a Python program to minimize the difference between the simulated and experimental phase maps. A single (volume) susceptibility is used to describe the whole battery in these examples, although further battery-specific models could be used, wherein different susceptibilities are assigned to different regions within the battery.

Results

Figure 18:
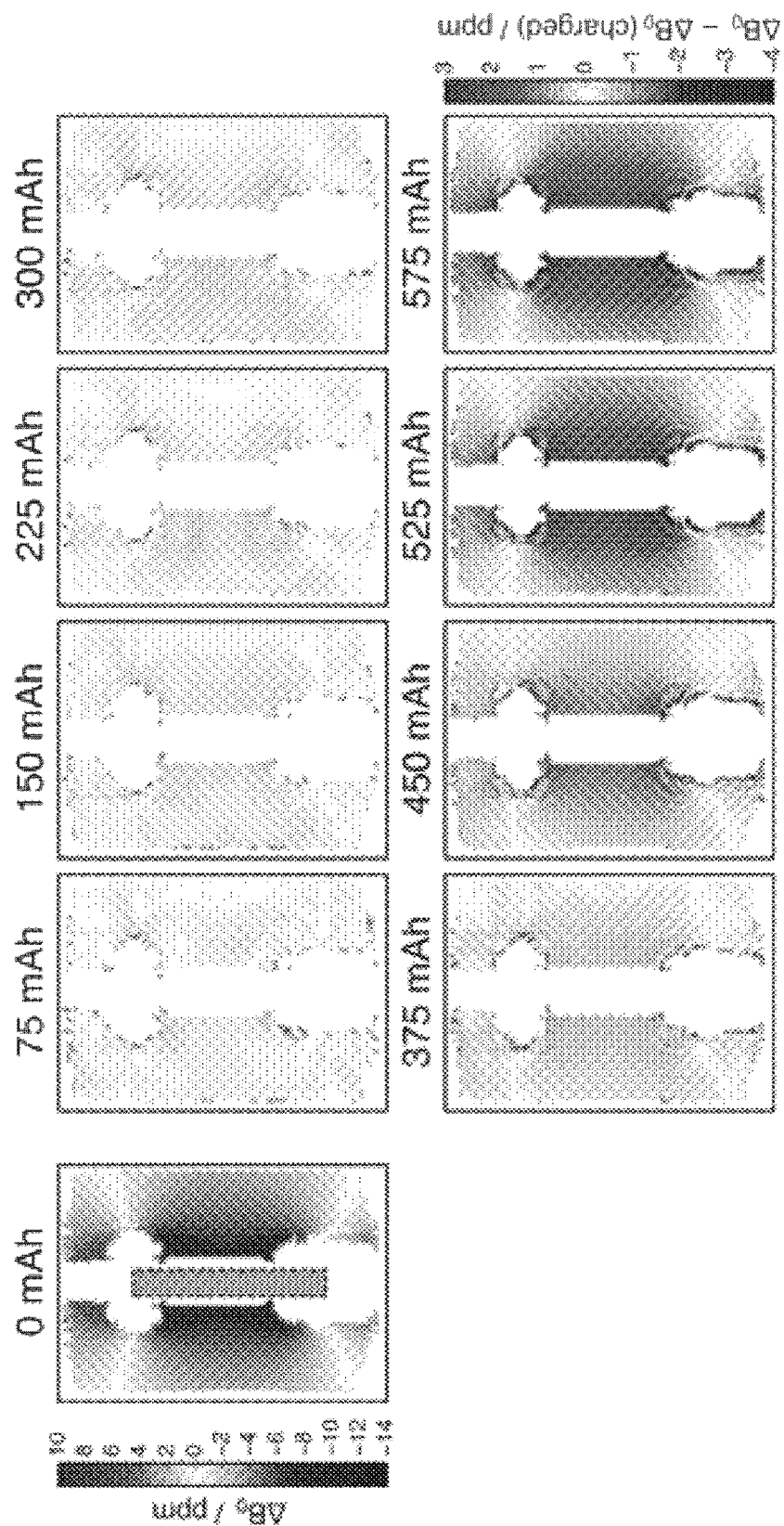
FIG. 18 illustrates reconstructed magnetic field maps surrounding the battery as it is discharged in situ. The discharge level is indicated in reference to the discharge capacity. The map for the fully charged battery (top left) is shown after subtraction of the background field map (top left colorbar), while the rest of the maps are given relative to the field map of the 0 mAh, fully charged battery (bottom right colorbar). The approximate position of the battery is illustrated in the top left image.

FIG. 18 shows the reconstructed field maps for one of the batteries, with snapshots taken at different points during discharge. When the battery is fully charged, the local field map varies from −14 to +10 ppm. Most regions of the map are successfully reconstructed, although close to the corners of the battery there is complete cancellation of the signal. This effect is due to the rapidly changing field, and occurs where the phase changes by close to $2\pi$ or more across a single voxel. These regions impact a limited area of the map and did not compromise further analysis.

The remaining images in FIG. 18 chart the relative changes in the field map as the battery is discharged. During the initial stages of discharge (75-300 mAh) the changes are relatively minor, with the magnitude of the field reducing (indicating that the average magnetic susceptibility inside the battery is also reducing) within approximately 0.5 ppm of the fully charged case. The changes are accelerated at higher stages of discharge (375-575 mAh) until there is up to 3-4 ppm change in magnitude at the fully discharged state.

The field maps are used to estimate the average magnetic susceptibility of the materials inside of the battery (FIG. 19), as detailed in the methods section. Following the trends visible in the field maps, the fits show the susceptibility of the battery to change only slightly until 350 mAh, when there is a strong decrease to approximately 70% of the maximum value. The trends are the same on charge as on discharge, suggesting that the oxidation state of the electrode materials is the same at equivalent points on charge versus discharge. If the materials and their relative volume fractions inside the battery were known, it would be straightforward to calculate the magnetic susceptibility at each stage of lithiation for the anode and cathode, and to convert the susceptibility axis in the plot in FIG. 19 to a lithiation fraction for each material.

Figure 19:
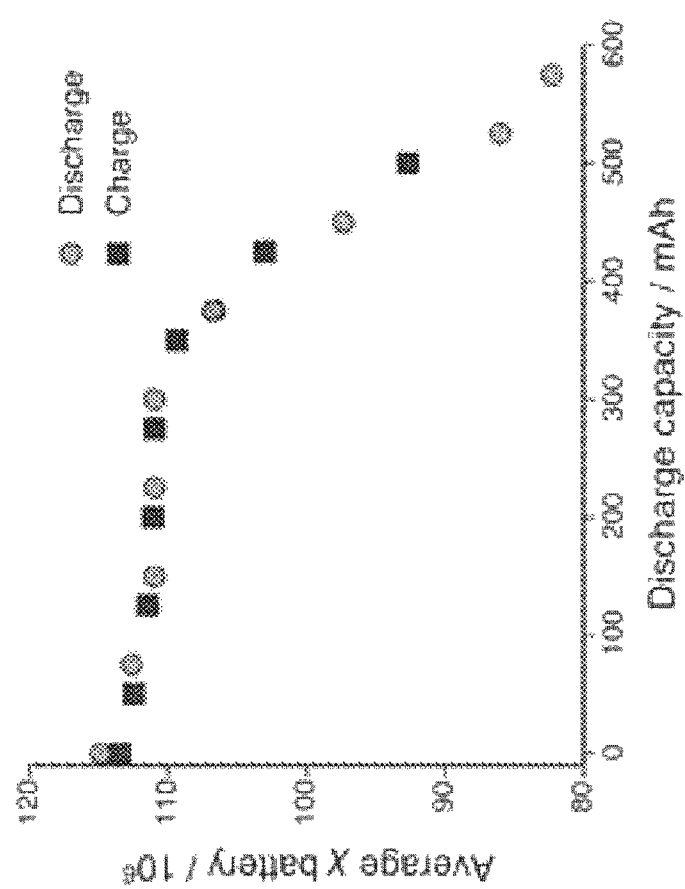
FIG. 19 illustrates values for the magnetic susceptibility of the whole battery obtained by fitting the sagittal imaging slices from FIG. 18.

The curve in FIG. 19 can also be used to calibrate the measured susceptibility as an indicator of the current state of charge (SOC) of the battery. This method would be particularly effective at discharge capacities above 300 mAh where the susceptibility changes are greater, but it could be combined with voltage and other measurements to classify batteries in the initial stages of discharge. The calibration curve would be slightly different for each type of battery and constituent chemistry.

Figure 23:
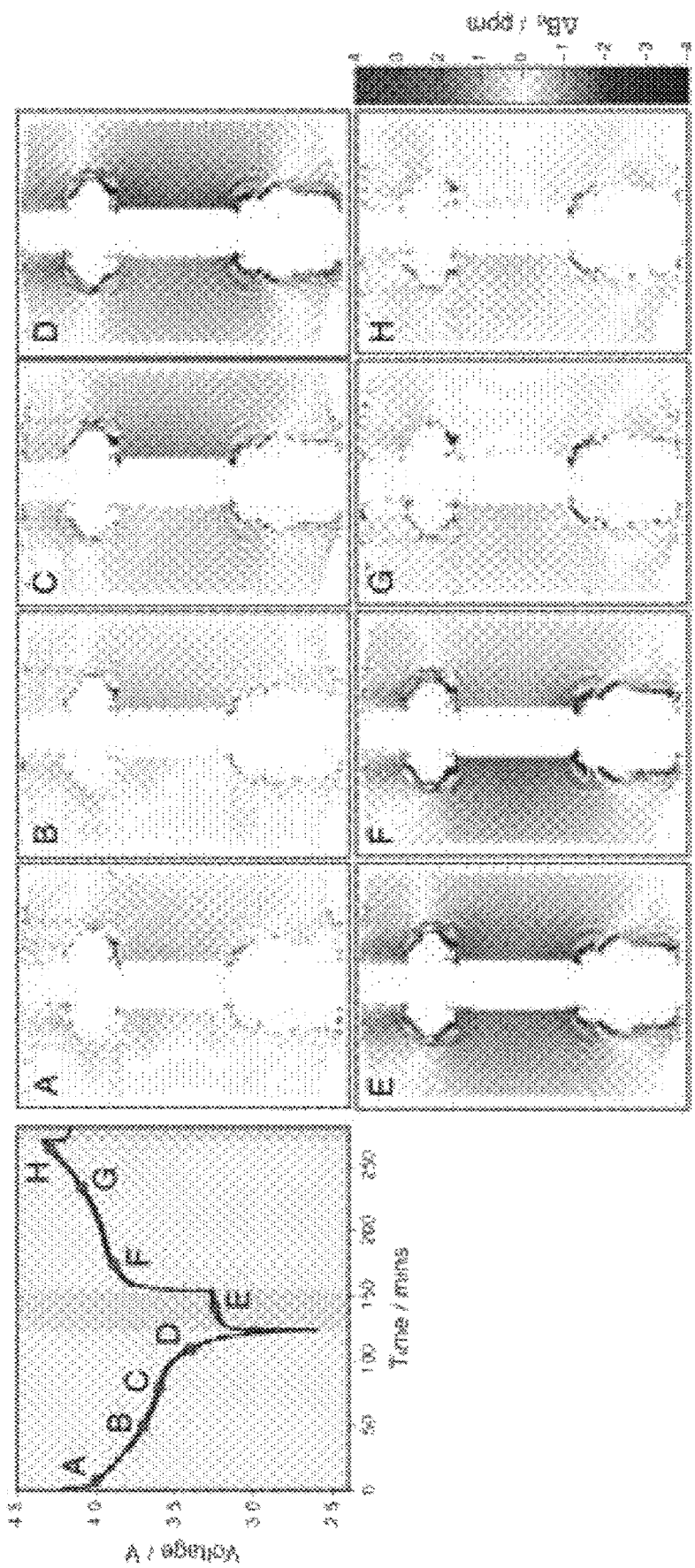
FIG. 23 illustrates sagittal snapshots of the field maps during the in situ discharge/charge cycle.

The experiments were repeated in situ on a second (fresh) cell, with a charge/discharge rate of 0.5 C and 30-minute rest periods after charge/discharge. The results of the consecutive imaging scans are shown in FIG. 23, which displays sagittal snapshots of the field maps during the in situ discharge/charge cycle. The labeled red circles on the electrochemistry plot indicate the times at which the eight images were acquired, while the smaller black squares on the voltage curve illustrate the positions of all of the images (not shown) taken during the acquisition series, demonstrating the high temporal resolution of the method. The $\Delta B_0$ map of the fully charged battery is subtracted from the displayed field maps. The maps show an asymmetry between the left and right sides of the cell; during discharge, the right side of the map has a higher field shift than the fully charged reference image (red regions) while the left side of the map has a lower field (blue regions). During the charge period, this trend is reversed. Thus, it appears that the left and right sides of the detection medium 'see' batteries with differing magnetic susceptibilities.

Figure 20:
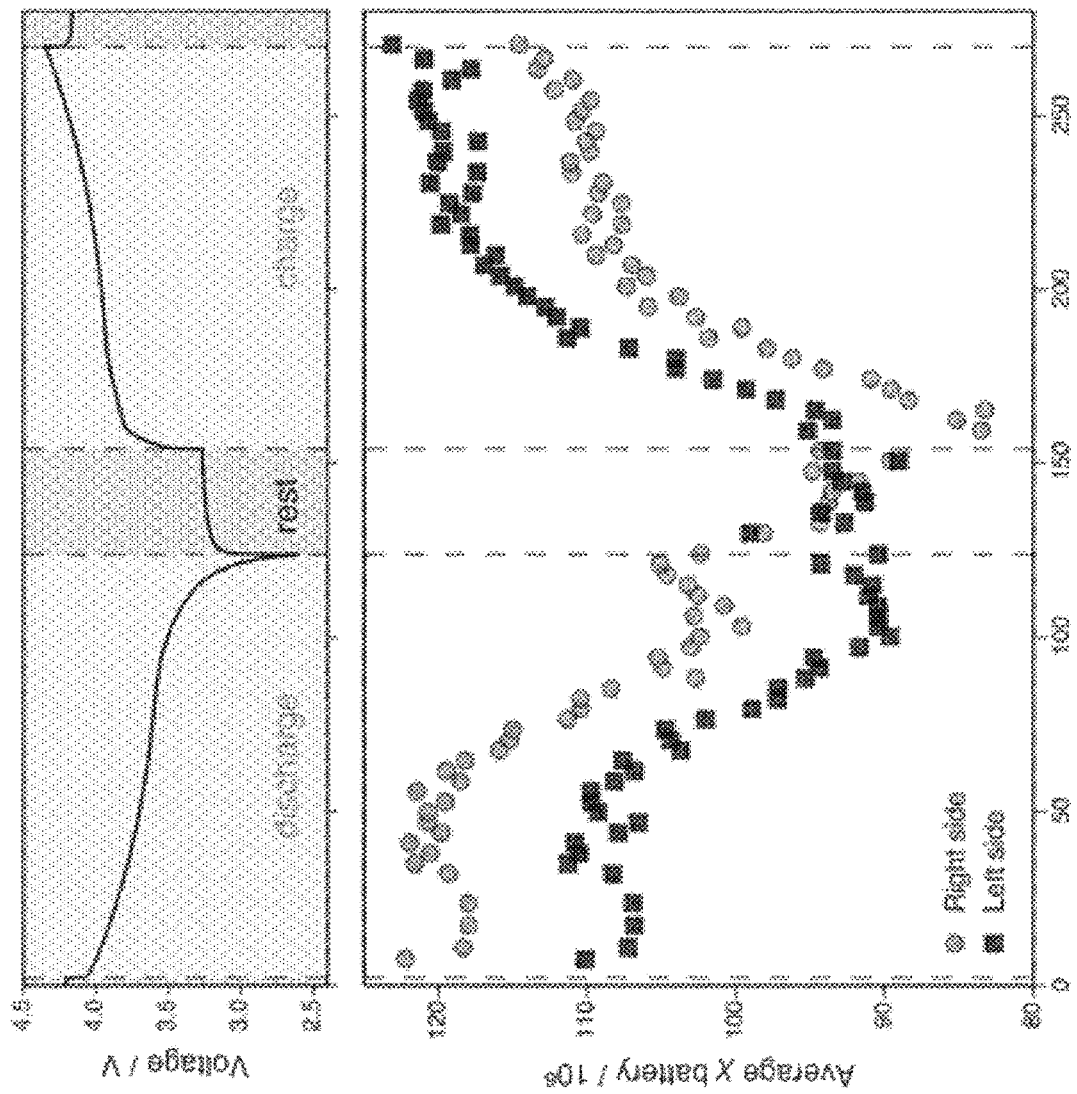
FIG. 20 illustrates fitted susceptibilities of the left and right sides of the battery during the in situ charge/discharge cycle at a rate of 0.5 C inside the NMR magnet. The voltage curve is displayed for the same time period (top).

To account for the spatial variation, fits of the experimental susceptibility distribution were performed separately for the left and right sides of the image, obtaining separate estimates of the battery susceptibility for each. This method was preferred to one in which each side of the battery was assigned independent susceptibilities, with the latter resulting in more time consuming and unstable fits. The results (FIG. 20) show there to be a significant, ca. $1 \times 10^{-5}$ difference in battery susceptibilities obtained from the right and left sides of the battery, with the right side sensing a higher susceptibility on discharge and the left side a higher susceptibility on the subsequent charge, with a significant swing in the susceptibilities during the resting step between the two periods and subsequent reversal of the applied current direction.

This type of spatial variation is not observed in the ex situ results. This difference may be due to the extra time during which the battery can relax before the experiments are performed ex situ. A second possibility is that the application of the current itself results in an additional modification to the magnetic field, which could be calculated according to the Biot-Savart Law if the current distribution were known. When the current changes direction the magnetic field should also reverse, as is observed in FIG. 20. Furthermore, this explanation for the phenomenon would lead to almost instantaneous changes in the measured field when the applied current is switched on or off, as appears to be the case. Applicant believes that the field change should be proportional to the current. If the field change is due to the applied current, the effects can be isolated by measuring the field change as a function of the applied current and separating this contribution from the magnetic susceptibility effects. The result will be a magnetic field map that can be related to the current distribution inside the battery, also a unique and powerful method.

Figure 21:
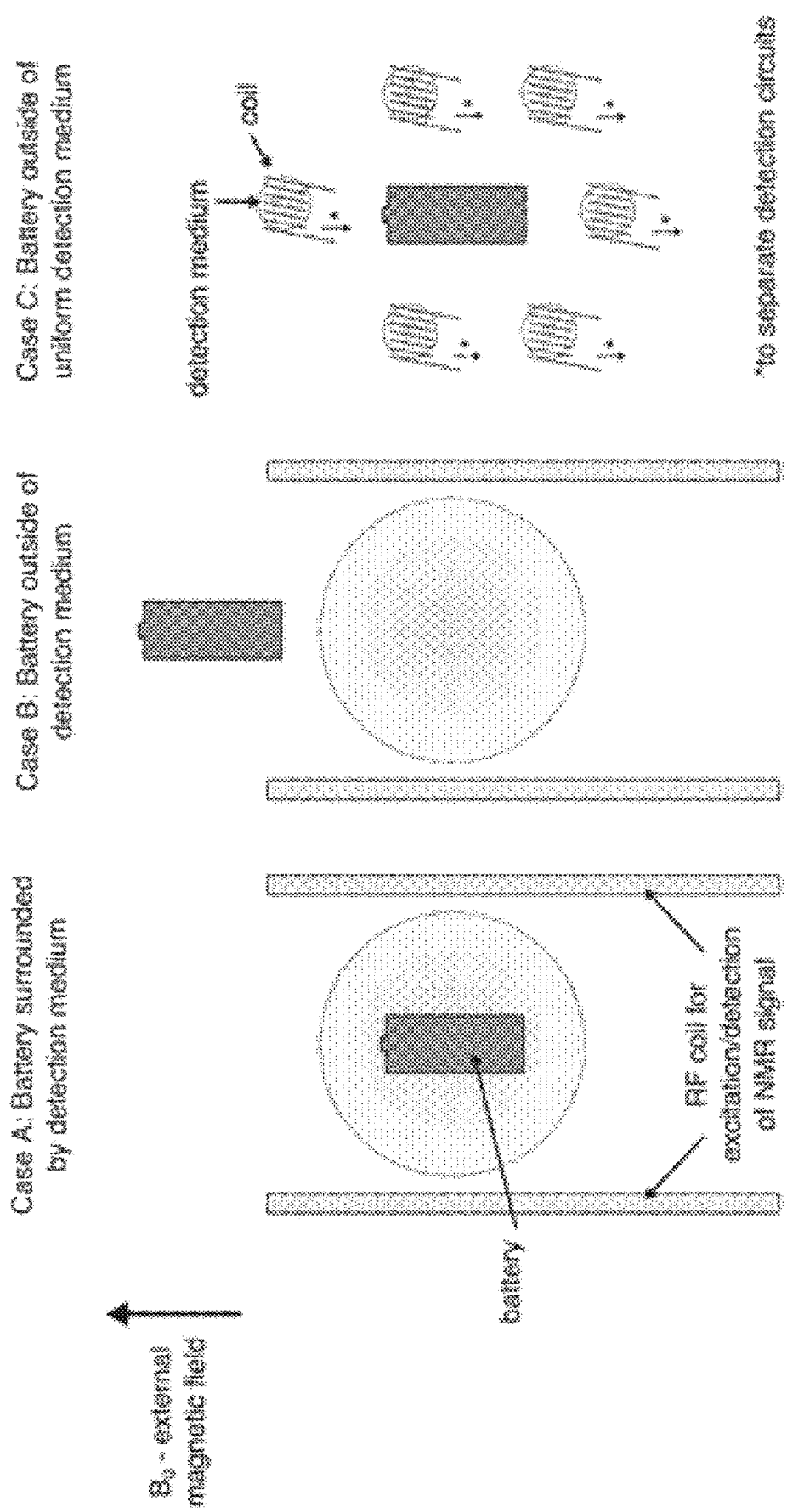
FIG. 21 illustrates an "in medium" setup, an "out of medium" setup, and a "spectroscopic" setup for indirectly diagnosing the health of a battery by characterizing a frequency distribution of a detection medium.

The above examples described an "inside-medium" setup (Case A of FIG. 21). In another implementation, an "outside-medium" setup is used in which the detection medium is placed in a vicinity of the battery (Case B of FIG. 21) at a predetermined distance (e.g., several centimeters or less), depending on the size of holder containing the battery, and the container containing the detection medium. In this implementation, the experimental protocol will be identical to that of the "inside-medium" setup described above, using the same MRI and image processing methodology to recover a field map of the detection medium, only the calculations used to fit the battery magnetic susceptibility will differ to reflect the geometry of the "outside-medium" setup. In the outside-medium setup, the holder only contains the battery. The holder does not contain detection medium. Instead, the detection medium is housed in a separate container. It is preferable that the container containing the detection medium is placed as close as possible to the holder containing the battery, but if there are strong magnetic artifacts, the detection medium can be moved further away to minimize the artifacts and maximize the useful signal. The preferred maximum distance between the detection medium and the battery is a few cm, but in some cases, the container containing the detection medium could be large (e.g., 10-30 cm diameter), thereby increasing the maximum distance. The maximum distance between the conducting structure and the detection medium is roughly equal to the battery dimensions. The detection medium for the "outside-medium" setup has the same minimal requirements described in the examples above. The radiofrequency coil can be placed immediately around the detection medium, or a bigger radiofrequency coil can used which encompasses the whole volume including the battery. The sensitivity will be better when the radiofrequency coil is placed immediately around the detection medium.

In a third implementation referred to as a "spectroscopic" setup (see Case C of FIG. 21), the idea of the "outside medium" setup is extended. In particular, the "spectroscopic" setup includes multiple detection volumes (i.e., the detection medium is divided into a plurality of separate volumes), each encapsulated in a radiofrequency coil with separate detection circuits. In this implementation, the detection medium is restricted to small volumes (<1 cm$^3$), such that the field is uniform (<0.5 ppm variation) over the corresponding region. In this case, the measurement will consist of an NMR chemical shift spectrum (single pulse-acquire sequence) that will give a single estimate of $\Delta B_0$ in the vicinity of each detection medium that are distributed in 3D around the battery. By fixing the coordinates of each detection medium with respect to the battery position, $\Delta B_0$ (r), a finite region of the overall field map can be reconstructed and fit against a calculated susceptibility distribution in the same way as described for the imaged field maps. This method has the advantage of being much faster than the MRI-based techniques and can be performed without requiring MRI gradients.

Figure 24:
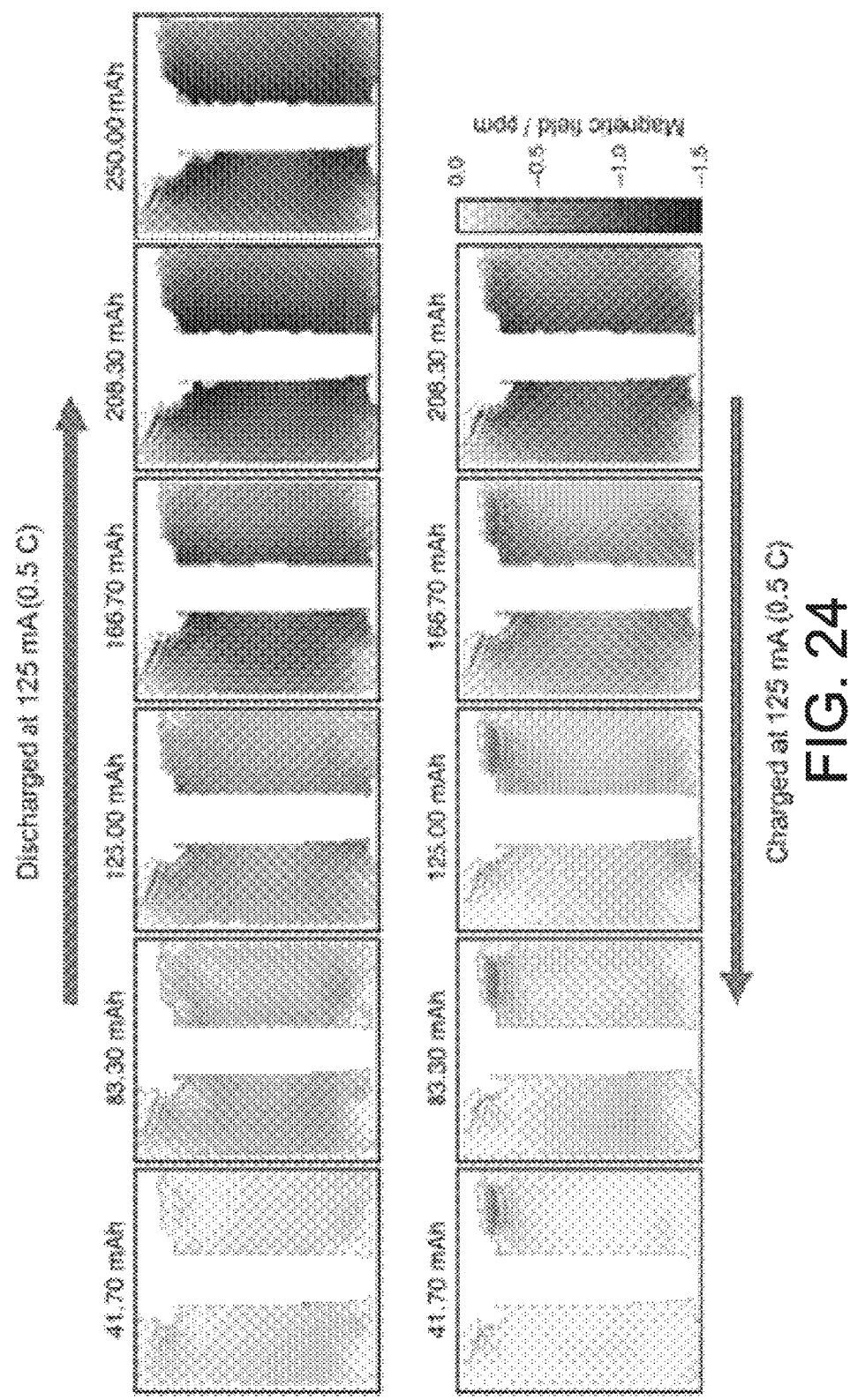
FIG. 24 shows a series of magnetic field maps taken at intervals during discharge and then charge of the cell. The plots are labeled by the discharge capacity of the cell at each step. The magnetic field is displayed with the fully charged cell as reference. The RIT cell was used for this purpose, and the susceptibility increased upon discharge.

In another example, the magnetic field can be used as a diagnostic for a cell's state of charge and to measure inconsistencies and defects in a cell's construction. FIG. 24 shows the change in the field map measured around the cell at discrete steps during discharge and then charge. The maps show that the field gradually reduces during discharge, to a minimum of −1.5 ppm (14.1 µT) lower than in the fully charged cell, with the reverse trend followed on the subsequent charge steps. The changes occur in a mostly symmetric fashion, with two symmetry planes bisecting the map vertically and horizontally.

Each step in the charge/discharge profile in FIG. 24 results in a unique field map, with changes that can be readily measured. This one-to-one mapping between charge state and the measured field map can therefore provide a fast tool for recovering the state of charge of an unknown cell, which may not be available from voltage measurements for many cell types, especially if the cell is compromised. More importantly, because it is the variation in the oxidation states of the anode and cathode materials that drive the differences in the measured bulk magnetic susceptibility, the field maps can provide vital additional information about cell health.

From this data, one can derive the cell's susceptibility changes over the charge cycle. FIG. 25 shows how the bulk magnetic susceptibility changes during discharge for two types of cells. The RIT cell uses NMC ($Li_xNi_yMn_yCo_{1-2y}O_2$) as the cathode material, and it is known that the magnetic susceptibility of this material increases with lithiation level. By contrast, results are also shown for a commercial cell with LCO (LixCoO2) as the cathode material. In that case, susceptibility decreases upon cathode lithiation (discharge), as described in the literature. Both of these effects are clearly observed over a full cycle in FIG. 25A, and can be measured precisely. The analysis shown in FIG. 25A is based on the simplest-possible model, the susceptibility being distributed uniformly across the cell. Knowing the geometry and the materials of the cell, however, one can obtain a more detailed analysis and extract the susceptibility changes of the cathode materials alone, which are shown in FIG. 25B.

Figure 26:
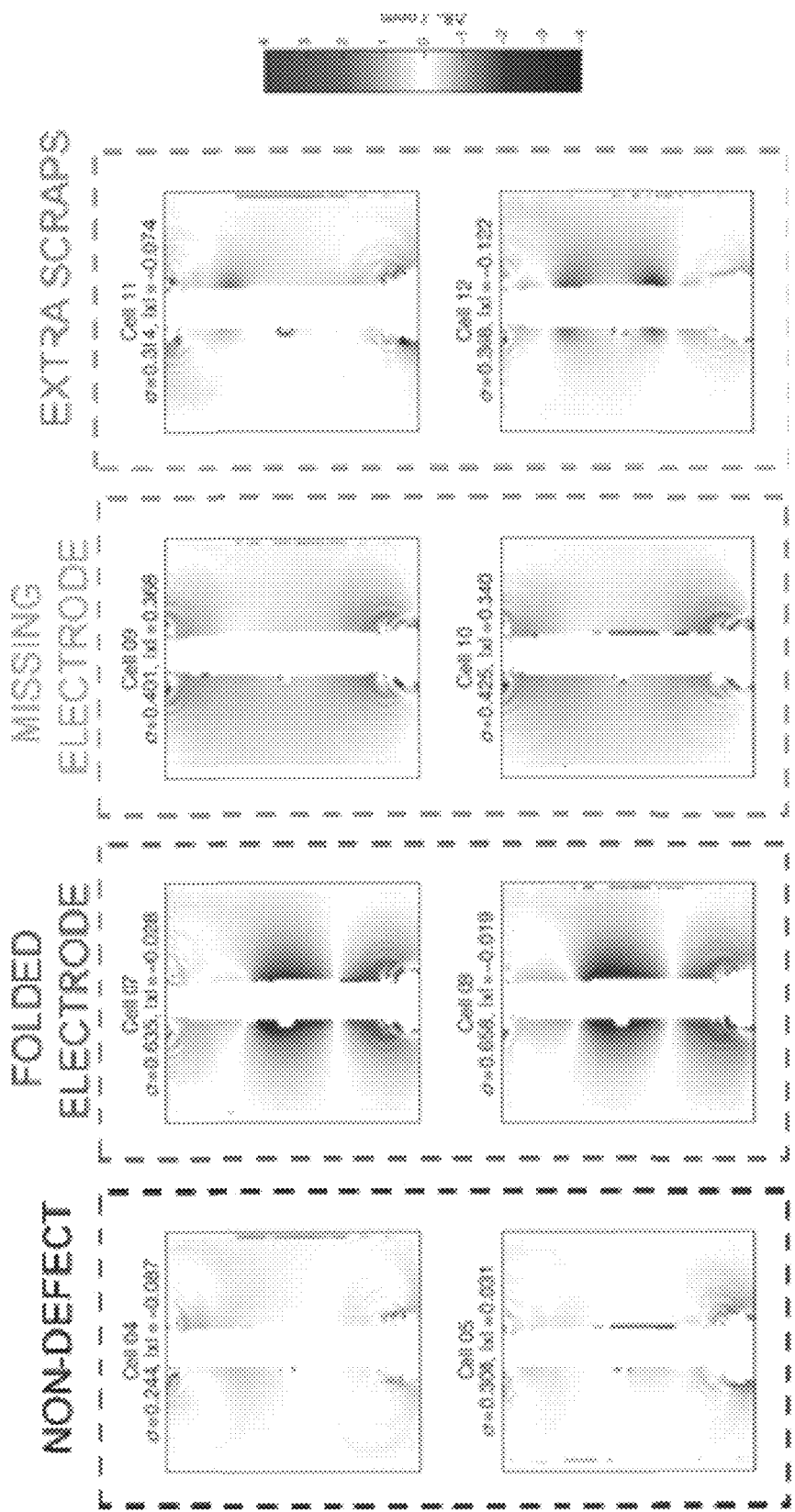
FIG. 26 shows magnetic field maps for the defect cells, with the mean and standard deviation indicated (taken over all of the voxels in each image). The fields are given relative to one of the non-defect cells (not shown).

Both the spatial dependence of the oxidation state, and the distribution of the material in space also affect the bulk magnetic susceptibility. Therefore, this tool can be used to detect changes in the cell over time, as well as physical defects in a cell. FIG. 26 shows the resulting field maps when the method is applied to a series of pouch cells that are purposely defected by either folding one of the cathodes, removing a cathode altogether, or adding small scraps of electrode material into the cell construction. Not only do the measured field maps show strong differences that are indicative of the defect types, the observed changes are also intuitive and diagnostic. For example, when the electrode is folded, new features are observed in the image at the locations where the fold occurs. When there is a missing cathode, the mean value of the field noticeably increases, as would be expected. The changes are subtler when extra scraps are added to the cell, but there is a slight increase in the mean and standard deviation of the measured magnetic field. Furthermore, the MRI method is sensitive enough to resolve significant differences for even the two cells which were prepared without defects. These small differences may not result in critical cell failures but could still affect overall cell capacity and performance. This additional information could be leveraged by correlating data from a large number of cell magnetic field maps with their synthesis/manufacturing conditions and electrochemical performance. It should be noted that the susceptibility measurements shown here can also be performed with cells that are not fully finished (i.e. do not contain electrolyte), and thus a manufacturer could potentially avoid a costly finishing and formation cycle of cells that are shown to be defective at this stage. The defective cells studied here were in that form (without electrolyte) to illustrate this point.

Figure 27:
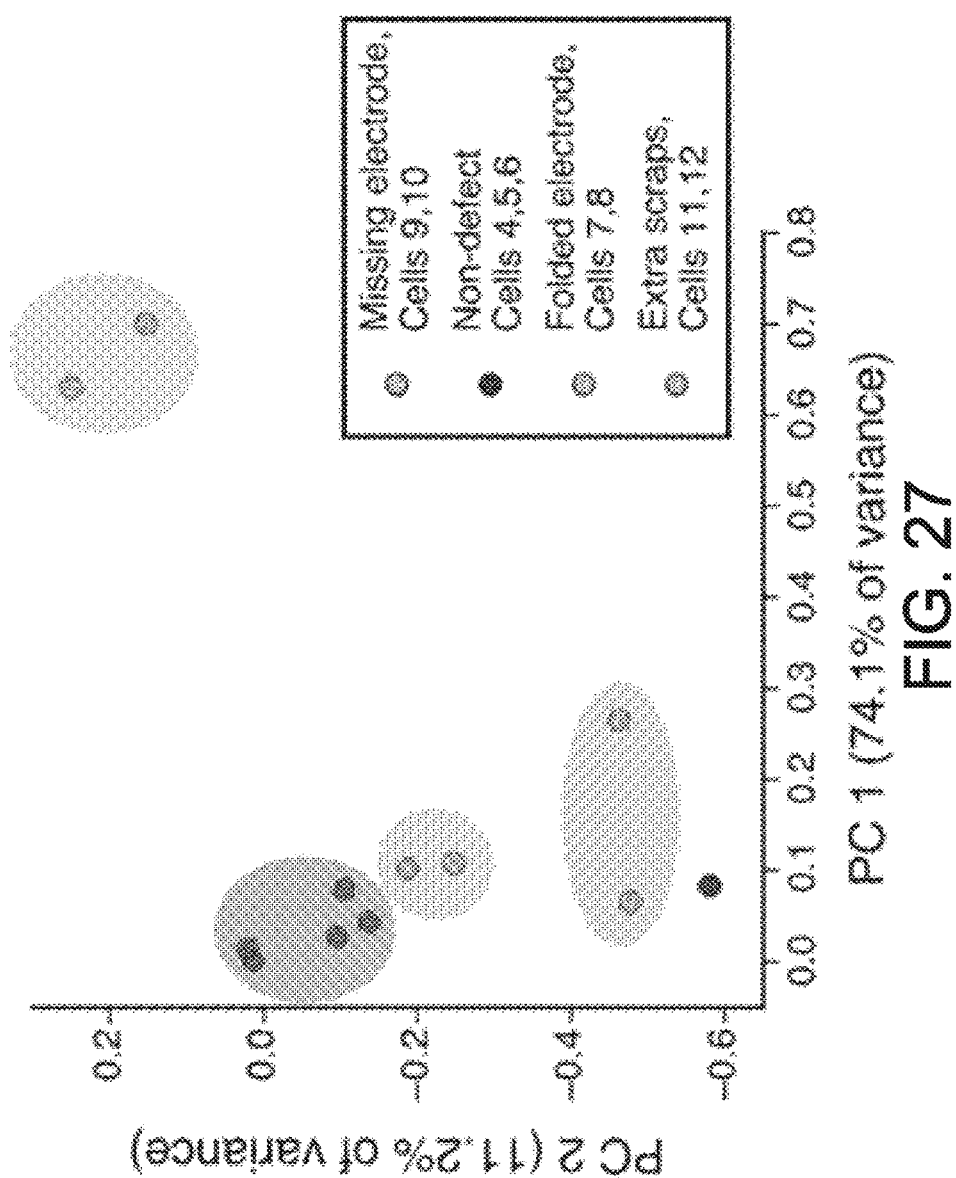
FIG. 27 shows principal component analysis performed on the magnetic field maps of the cells shown in FIG. 26.

Although many defects are clearly visible and interpretable from the field maps directly (FIG. 26), further opportunities arise when one considers a potentially high-throughput application. The measurements are sufficiently fast to be performed on a large number of cells, and the results could be correlated with additional cell characteristics to predict cell differences based on subtle features in the maps. To illustrate this point, a principal component analysis (PCA) was performed using the 2D images from FIG. 26 on the limited number of samples available here. The PCA score plot is shown in FIG. 27, where a strong grouping can be seen for each of the cell types. Interestingly, while it could be difficult to visually differentiate between the non-defected cells and those with extra scraps, the PCA shows a clear grouping and separation using the second principal component.

In this example, the PCA was performed on the 2D magnetic field maps which are themselves reconstructed from multiple phase map images. In this kind of analysis there is no requirement for the input data to be a coherent image. Instead, optimized experiments could be designed that sample the regions of k-space that are expected to vary most strongly. In this manner, the diagnostic power of the experiments could be preserved (or even improved) while drastically reducing the overall experiment time. This latter approach could further benefit from a big data approach, in which machine learning algorithms could be used to more efficiently classify cells by defect type. In this way, one could further enhance the information content of the observed magnetic field maps.

The systems and methods described in this specification use magnetic resonance to indirectly measure internal characteristics of a battery. By measuring the detection method, as opposed to the voltage and resistance/impedance of the battery itself, it is possible to evaluate the internal characteristics of any commercial battery of any geometry, including a commercial battery encased in conducting material.

The embodiments also demonstrate the opportunities of MR-based susceptometry for diagnosing the state and quality of rechargeable Li-ion cells. The technique is fast, non-destructive, and is based on measuring the small induced and permanent magnetic field changes around a cell. It has been shown that the lithiation state of cathodes, in particular, can be assessed at various stages in the charging cycle, although any overall susceptibility changes can be observed as well. Furthermore, the possibility for detecting defects in cells has been explored, which could be determined even in unfinished cells. Additional differences can be observed between nominally non-defect cells. These methods could become particularly powerful if applied to large numbers of cells, where PCA or machine learning algorithms could operate on reduced data sets. Overall, it is hoped that this new noninvasive methodology will enable faster progress in the development of new battery materials and cell designs that address current and future needs.

In the embodiments described above, a new MR technique was demonstrated, which overcomes the limitations described in the Background Information Section, and provides cell diagnostics without requiring rf access to the inside of the cell. The technique is based on imaging the induced or permanent magnetic field produced by the cell, and connecting it with processes occurring inside the cell. The reason that this magnetic field is so informative, is that the magnetic susceptibility $\chi$ is material-dependent, and that the resulting magnetic field is dependent on the distribution of the materials inside of the cell, which change during cell operation.

The magnetic susceptibility also depends on the electronic configuration of the material and hence during redox reactions, such as battery charging or discharging, there can be large changes in magnetic susceptibility. Measurements of magnetic susceptibility can therefore yield detailed information about the oxidation state of the materials inside an electrochemical device to give insights into the state of charge (SOC) of the battery and its failure mechanisms. Furthermore, the magnetic susceptibilities of many widely-used electrode materials, including, for example $Li_xMnO_2$, $Li_xFePO_4$, $Li_xCoO_2$ and $Li_xNi_yMn_yCo_{1-2y}O_2$, depend upon their lithiation state. Graphite, a popular anode material, is strongly diamagnetic and has a highly anisotropic susceptibility. In this case, as $Li^+$ intercalates into the structure, the inter-layer distance in the graphite increases and the susceptibility and its anisotropy are significantly reduced. This effect is highly dependent on the stage (the number of graphite layers between each lithium layer) of the resulting lithium intercalate.

Monitoring the magnetic field produced by the cell when it is placed into an external magnetic field thus offers the ability to monitor the electrochemical reaction in situ. Moreover, the distribution of magnetic material inside the cell influences the spatial variation in the magnetic field that it produces, such that it is also sensitive to the precise construction of the cell. In this manner, measures of the magnetic field can be used to screen for physical defects in cells.

MR methods provide the ability to measure tiny changes in magnetic field maps, for example, through the use of phase-map imaging or specific NMR probes. In the phase-map imaging approach, multiple images are acquired at different echo times and used to reconstruct the spatial variation in the induced resonance frequency shift from the evolution of the signal phases. In this manner, very accurate field maps can be obtained—of the order of $\mu T$. Since ultimately, the magnetic field changes are measured, apart from measuring the magnetic properties of a device, one could also measure current distributions in the same manner, which could arise, for example, in the relaxation phase between charging steps, or during charging or discharging itself.

As demonstrated, the magnetic field can be accurately measured by MR around a Li-ion pouch cell. As the cell is charged, the field changes in a highly predictable manner. The results can be used, for example, to determine the oxidation state of the cathode as a function of charge. Furthermore, the method has been applied to pouch cells with specific defects and show that the results are sensitive to a range of such defects that could happen during assembly. Indeed, the measure is so sensitive that even nominally non-defect cells can show significant differences between each other, arising from small preparation differences, thus potentially providing a "fingerprint" of each cell, or providing important feedback for the adjustment of manufacturing equipment.

The described susceptibility or electrical current measurements can be enhanced by (1) an inverse calculation of susceptibility maps or electrical current maps from the magnetic field maps using deconvolution or similar algorithms, and by (2) measuring magnetic field maps with the object oriented at different angles with respect to the static magnetic field. Both approaches can be combined. The orientation change is helpful for enhancing accuracy in the susceptibility or electrical current map calculations.

The properties leading to the observed magnetic field changes can be based on permanent or induced magnetic susceptibility, ferro-, para-, antiferro-, or diamagnetism, or electrical or ionic currents (direct or alternating current) within the object.

One particular embodiment could include electrochemical cells incorporated into a bigger device, such as a battery of several cells, or a cell or a battery incorporated into a device such as a cell phone, and the whole device could be analyzed in this fashion.

Described above are systems and methods for using and exploiting the effect of electromagnetic field distortions (skin effect) induced by conductive or semi-conductive materials or phases of matter in order to excite and detect spins at specific depths within such matter, with a selectivity of approximately $0.25\delta$. This technique allows the acquisition of a depth profile of a conductor with a resolution far exceeding that of any MRI experiment and without the use of external magnetic field gradients, thus it is appropriately called a super-resolution methodology. Furthermore, the sequence can be combined with other MR sequences or imaging techniques to take depth-dependent measurements. At the heart of these super-resolution techniques lie not just the principle of reciprocity as formulated within the context of magnetic resonance, but also the specific dependence of the signal phases in response to propagation within conductive media. Further applications are described related to determining susceptibility and electrical current distributions within batteries or electrochemical devices by measuring the induced or permanent magnetic fields within the object through its effects on the surrounding medium.

Although all the magnetic field measurements described in the embodiments above were performed using magnetic resonance, aspects of the invention are not limited in this regard. In other embodiments, the magnetic field measurements may be performed with a methodology other than magnetic resonance, for example, using a SQUID magnetometer.

Implementations described in this specification can be implemented in digital electronic circuitry, or in computer software, firmware, or hardware, including the structures disclosed in this specification and their structural equivalents, or in combinations of one or more of them. The implementations described in this specification can be implemented as one or more computer programs, i.e., one or more modules of computer program instructions, encoded on one or more computer storage media for execution by, or to control the operation of, data processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, or other storage devices). Accordingly, the computer storage medium is both tangible and non-transitory.

Figure 9:
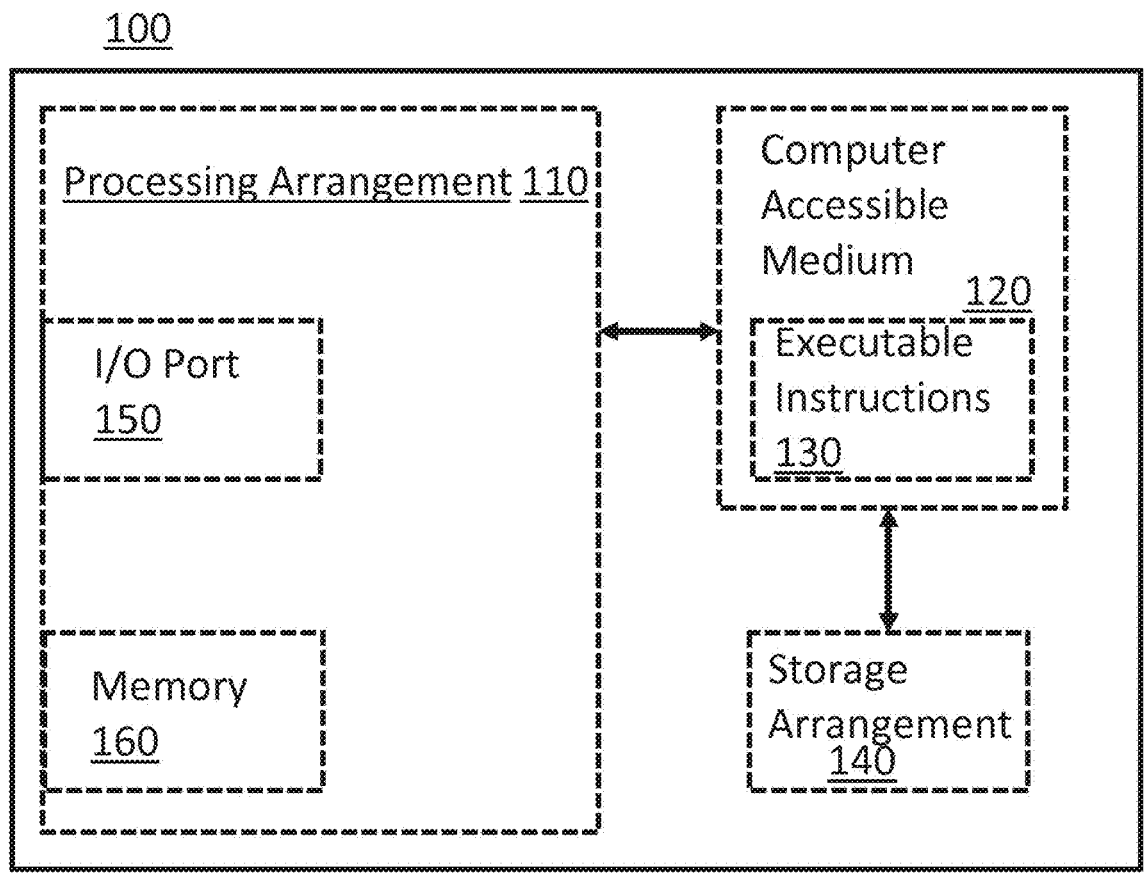
FIG. 9 illustrates one embodiment of a computer system for implementing an embodiment of the methods described herein.

As shown in FIG. 9, e.g., a computer-accessible medium 120 (e.g., as described herein, a storage device such as a hard disk, floppy disk, memory stick, CD-ROM, RAM, ROM, etc., or a collection thereof) can be provided (e.g., in communication with the processing arrangement 110). The computer-accessible medium 120 may be a non-transitory computer-accessible medium. The computer-accessible medium 120 can contain executable instructions 130 thereon. In addition or alternatively, a storage arrangement 140 can be provided separately from the computer-accessible medium 120, which can provide the instructions to the processing arrangement 110 so as to configure the processing arrangement to execute certain exemplary procedures, processes and methods, as described herein, for example. The instructions may include a plurality of sets of instructions. For example, in some implementations, the instructions may include instructions for applying radio frequency energy in a plurality of sequence blocks to a volume, where each of the sequence blocks includes at least a first stage. The instructions may further include instructions for repeating the first stage successively until magnetization at a beginning of each of the sequence blocks is stable, instructions for concatenating a plurality of imaging segments, which correspond to the plurality of sequence blocks, into a single continuous imaging segment, and instructions for encoding at least one relaxation parameter into the single continuous imaging segment.

System 100 may also include a display or output device, an input device such as a key-board, mouse, touch screen or other input device, and may be connected to additional systems via a logical network. Many of the embodiments described herein may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols. Those skilled in the art can appreciate that such network computing environments can typically encompass many types of computer system configurations, including personal computers, hand-held devices, multi-processor systems, microprocessor-based or programmable consumer electronics, network PCs, minicomputers, mainframe computers, and the like. Embodiments of the invention may also be practiced in distributed computing environments where tasks are performed by local and remote processing devices that are linked (either by hard-wired links, wireless links, or by a combination of hardwired or wireless links) through a communications network. In a distributed computing environment, program modules may be located in both local and remote memory storage devices.

Various embodiments are described in the general context of method steps, which may be implemented in one embodiment by a program product including computer-executable instructions, such as program code, executed by computers in networked environments. Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web implementations of the present invention could be accomplished with standard programming techniques with rule based logic and other logic to accomplish the various database searching steps, correlation steps, comparison steps and decision steps. It should also be noted that the words "component" and "module," as used herein and in the claims, are intended to encompass implementations using one or more lines of software code, and/or hardware implementations, and/or equipment for receiving manual inputs.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Thus, particular implementations of the invention have been described.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. Therefore, the above embodiments should not be taken as limiting the scope of the invention.

What is claimed is:

1. A method of probing the layers above, at, and below the surface of a conducting region comprising:
exciting nuclear or electronic spins within the conducting region using a first frequency;
receiving a second frequency from the conducting region;
determining the length scales by the conductivity of the conducting region, the first frequency, and the second frequency;
obtaining a depth profile of the conducting region, the depth profile including a plurality of slices from a surface of an object;
tuning a thickness of a slice of the plurality of slices; and
indirectly measuring the presence of the surface by characterizing signal distortions above the surface of the conducting region based on the thickness of the slice of the plurality of slices.

2. The method of probing the layers above, at, and below the surface of a conducting region of claim 1, wherein the conducting region is selected from a group consisting of a metallic conductor, a semi-conductor, a plasma, an electrolyte solution, and a superconductor.

3. The method of probing the layers above, at, and below the surface of a conducting region of claim 1, further comprising tuning the length scale by choosing the operating frequencies.

4. The method of probing the layers above, at, and below the surface of a conducting region of claim 1, wherein the first frequency is the same as the second frequency.

5. The method of probing the layers above, at, and below the surface of a conducting region of claim 1, wherein the first frequency is different from the second frequency.

6. The method of probing the layers above, at, and below the surface of a conducting region of claim 5, wherein the first frequency and the second frequency are different due to magnetization transfer, and the magnetization transfer is due to selection from a group consisting of cross-polarization, INEPT, and DEPT.

7. The method of probing the layers above, at, and below the surface of a conducting region of claim 1, wherein the receiving step is done using the induced magnetic flux in a detection coil by the precessing spin magnetization.

8. The method of probing the layers above, at, and below the surface of a conducting region of claim 7, further comprising applying a shape function to the signal received from the detection coil, wherein the shape function directly scales the detected signal at each depth.

9. The method of probing the layers above, at, and below the surface of a conducting region of claim 1, further comprising the first frequency flipping a plurality of nuclear or electron spins in the conducting region.

10. The method of probing the layers above, at, and below the surface of a conducting region of claim 9, further comprising detecting the precession motion of the plurality of nuclear or electron spins that have been flipped by the first frequency.

11. The method of probing the layers above, at, and below the surface of a conducting region of claim 1, comprising:
applying a pulse sequence comprising several rf pulses and delays, the pulse sequence based on a spatial dependence of rf field strength to pinpoint a depth in the object while avoiding interference from the plurality of slices.

12. A method of applying a pulse sequence to a region containing a conducting region comprising:
applying a pulse sequence comprising several rf pulses and delays, the pulse sequence based on a spatial dependence of rf field strength;
impregnating the conducting region with a pattern of z-magnetization; and
reading out the pattern of the z-magnetization.

13. The method of applying a pulse sequence to a conducting region of claim 12, wherein the pattern is a result of the application of repeated pulses which are attenuated and phase-shifted within the conducting region.

14. The method of applying a pulse sequence to a conducting region of claim 12, further comprising adjusting the z-magnetization pattern within the conducting region by a technique selected from 1) altering delays, pulse flip angles and repeats in the pulse sequence, 2) by the repeat of the pulse sequence with modified rf pulse phases, 3) by induced changes in conductivity within the layers, and 4) by changes in magnetic resonance relaxation parameters.

15. The method of applying a pulse sequence to a conducting region of claim 12, wherein the selected technique is by the repeat of the pulse sequence with modified rf pulse phases and wherein the adjusting the z-magnetization pattern results in the reduction of the presence of signals from different slice regions.

16. The method of applying a pulse sequence to a conducting region of claim 12, further comprising using repeating measurements obtained from the reading out the pattern step to quantify the concentration of electron or nuclear spins within the conducting region.

17. The method of applying a pulse sequence to a conducting region of claim 12, further comprising using the read out pattern of z-magnetization to measure one of magnetic resonance parameters, diffusion within the conducting region, or flow within the conducting region.

18. The method of applying a pulse sequence to a conducting region of claim 17, wherein the measured diffusion within the conducting region and a depth profile is used in spectroscopy.

19. A method of applying a pulse sequence to a non-conducting region of claim 12, comprising indirectly detecting microscopic structures of high magnetic susceptibility material using a gradient echo Magnetic Resonance Imaging experiment observing the surrounding medium, wherein the induced amplitude and/or phase changes of the detected signal are observed in order to inform on the properties and/or morphology of the microscopic structures.

20. The method of applying a pulse sequence to a non-conducting region of claim 19, further comprising tuning excitation pulse/repetition time to maximize the contrast afforded by inhomogeneities in the excitation/detection rf field amplitude and phase.

21. A computer-implemented machine for of probing the layers above, at, and below the surface of a conducting region, comprising:

a processor; and
a tangible computer-readable medium operatively connected to the processor and including computer code configured to:
excite nuclear or electronic spins within the conducting region using a first frequency; and
receive a second frequency from the conducting region;
determine the length scales by the conductivity of the conducting region, the first frequency, and the second frequency;
obtain a depth profile of the conducting region, the depth profile including a plurality of slices from a surface of an object;
tune a thickness of a slice of the plurality of slices; and
indirectly measure the presence of the surface by characterizing signal distortions above the surface based on the thickness of the slice of the plurality of slices.

22. A method for indirectly detecting the volume and porosity of conducting structures comprising:
measuring the space around the structure with magnetic resonance;
inferring the volume and porosity of the conducting structure based upon induced magnetic susceptibility shifts.

23. The method of claim 22, further comprising amplifying the induced magnetic susceptibility shifts by destructive interference.

24. A method of imaging a battery comprising:
providing a casing having a least a portion comprising non-conducting material configured to allow radio frequency waves to pass through the portion;
exciting nuclear or electronic spins within a conducting region of the battery using a first frequency;
receiving a second frequency from the conducting region;
determining the length scales by the conductivity of the conducting region, the first frequency, and the second frequency;
obtaining a depth profile of the conducting region, the depth profile including a plurality of slices from a surface of the battery;
tuning a thickness of a slice of the plurality of slices; and
indirectly measuring the presence of the surface by characterizing signal distortions above the surface of the conducting region of the battery based on the thickness of the slice of the plurality of slices.

* * * * *